(12) United States Patent
Pagaila et al.

(10) Patent No.: US 9,240,380 B2
(45) Date of Patent: Jan. 19, 2016

(54) SEMICONDUCTOR DEVICE AND METHOD OF FORMING INTERPOSER FRAME OVER SEMICONDUCTOR DIE TO PROVIDE VERTICAL INTERCONNECT

(71) Applicant: STATS ChipPAC, Ltd., Singapore (SG)

(72) Inventors: Reza A. Pagaila, Tangerang (ID); Seng Guan Chow, Singapore (SG); Seung Uk Yoon, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 0 days.

(21) Appl. No.: 13/715,424

(22) Filed: Dec. 14, 2012

(65) Prior Publication Data

US 2013/0105989 A1 May 2, 2013
US 2014/0327145 A9 Nov. 6, 2014

Related U.S. Application Data

(60) Division of application No. 12/875,981, filed on Sep. 3, 2010, now Pat. No. 8,383,457, which is a continuation-in-part of application No. 12/545,357, filed on Aug. 21, 2009, now Pat. No. 8,169,058.

(51) Int. Cl.
*H01L 23/48* (2006.01)
*H01L 23/538* (2006.01)
(Continued)

(52) U.S. Cl.
CPC ............ *H01L 23/5384* (2013.01); *H01L 21/56* (2013.01); *H01L 21/561* (2013.01);
(Continued)

(58) Field of Classification Search
CPC ..... H01L 21/563; H01L 21/568; H01L 21/58; H01L 24/97

USPC ......... 257/678, 687, 774, 777, 787, 788, 789, 257/E21.499, E21.5, E21.502, E21.503, 257/E21.505; 438/33, 106–127, 68, 455, 438/458, 460

See application file for complete search history.

(56) References Cited

U.S. PATENT DOCUMENTS 5,250,843 A 10/1993 Eichelberger
5,353,498 A 10/1994 Fillion et al.
(Continued)

FOREIGN PATENT DOCUMENTS

CN 1543291 A 11/2004
CN 1983533 A 6/2007
(Continued)

*Primary Examiner* — Khiem D Nguyen
(74) *Attorney, Agent, or Firm* — Robert D. Atkins; Patent Law Group: Atkins and Associates, P.C.

(57) ABSTRACT

A semiconductor device has a first semiconductor die mounted over a carrier. An interposer frame has an opening in the interposer frame and a plurality of conductive pillars formed over the interposer frame. The interposer is mounted over the carrier and first die with the conductive pillars disposed around the die. A cavity can be formed in the interposer frame to contain a portion of the first die. An encapsulant is deposited through the opening in the interposer frame over the carrier and first die. Alternatively, the encapsulant is deposited over the carrier and first die and the interposer frame is pressed against the encapsulant. Excess encapsulant exits through the opening in the interposer frame. The carrier is removed. An interconnect structure is formed over the encapsulant and first die. A second semiconductor die can be mounted over the first die or over the interposer frame.

27 Claims, 17 Drawing Sheets

(51) Int. Cl.
  *H01L 21/56* (2006.01)
  *H01L 21/683* (2006.01)
  *H01L 25/10* (2006.01)
  *H01L 25/00* (2006.01)
  *H05K 1/18* (2006.01)
  *H05K 3/00* (2006.01)
  *H01L 25/03* (2006.01)
  *H01L 25/065* (2006.01)
  *H01L 25/16* (2006.01)
  *H01L 23/29* (2006.01)
  *H01L 23/31* (2006.01)
  *H01L 23/498* (2006.01)
  *H01L 23/544* (2006.01)
  *H01L 23/00* (2006.01)

(52) U.S. Cl.
  CPC .......... *H01L21/568* (2013.01); *H01L 21/6835* (2013.01); *H01L 23/3128* (2013.01); *H01L 23/49833* (2013.01); *H01L 23/5389* (2013.01); *H01L 24/11* (2013.01); *H01L 24/19* (2013.01); *H01L 24/20* (2013.01); *H01L 24/24* (2013.01); *H01L 24/25* (2013.01); *H01L 24/27* (2013.01); *H01L 24/29* (2013.01); *H01L 24/32* (2013.01); *H01L 24/82* (2013.01); *H01L 24/83* (2013.01); *H01L 24/97* (2013.01); *H01L 25/03* (2013.01); *H01L 25/0655* (2013.01); *H01L 25/105* (2013.01); *H01L 25/16* (2013.01); *H01L 25/50* (2013.01); *H05K 1/186* (2013.01); *H05K 3/007* (2013.01); *H01L 23/295* (2013.01); *H01L 23/3107* (2013.01); *H01L 23/3121* (2013.01); *H01L 23/49827* (2013.01); *H01L 23/544* (2013.01); *H01L 24/03* (2013.01); *H01L 24/05* (2013.01); *H01L 24/13* (2013.01); *H01L 24/16* (2013.01); *H01L 24/48* (2013.01); *H01L 2221/68345* (2013.01); *H01L 2221/68381* (2013.01); *H01L 2221/68386* (2013.01); *H01L 2223/54426* (2013.01); *H01L 2224/0345* (2013.01); *H01L 2224/03452* (2013.01); *H01L 2224/03462* (2013.01); *H01L 2224/03464* (2013.01); *H01L 2224/0401* (2013.01); *H01L 2224/04042* (2013.01); *H01L 2224/04105* (2013.01); *H01L 2224/05611* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/06131* (2013.01); *H01L 2224/1132* (2013.01); *H01L 2224/1134* (2013.01); *H01L 2224/1145* (2013.01); *H01L 2224/11334* (2013.01); *H01L 2224/11462* (2013.01); *H01L 2224/11464* (2013.01); *H01L 2224/11849* (2013.01); *H01L 2224/11901* (2013.01); *H01L 2224/12105* (2013.01); *H01L 2224/131* (2013.01); *H01L 2224/13111* (2013.01); *H01L 2224/13113* (2013.01); *H01L 2224/13116* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/16225* (2013.01); *H01L 2224/21* (2013.01); *H01L 2224/215* (2013.01); *H01L 2224/2105* (2013.01); *H01L 2224/22* (2013.01); *H01L 2224/221* (2013.01); *H01L 2224/245* (2013.01); *H01L 2224/2405* (2013.01); *H01L 2224/24011* (2013.01); *H01L 2224/24101* (2013.01); *H01L 2224/24226* (2013.01); *H01L 2224/24227* (2013.01); *H01L 2224/25171* (2013.01); *H01L 2224/27002* (2013.01); *H01L 2224/29* (2013.01); *H01L 2224/2902* (2013.01); *H01L 2224/2919* (2013.01); *H01L 2224/29101* (2013.01); *H01L 2224/29144* (2013.01); *H01L 2224/29298* (2013.01); *H01L 2224/32155* (2013.01); *H01L 2224/32225* (2013.01); *H01L 2224/48091* (2013.01); *H01L 2224/48105* (2013.01); *H01L 2224/48175* (2013.01); *H01L 2224/48227* (2013.01); *H01L 2224/48228* (2013.01); *H01L 2224/73265* (2013.01); *H01L 2224/82101* (2013.01); *H01L 2224/82104* (2013.01); *H01L 2224/82106* (2013.01); *H01L 2224/83005* (2013.01); *H01L 2224/8385* (2013.01); *H01L 2224/83191* (2013.01); *H01L 2224/95001* (2013.01); *H01L 2224/97* (2013.01); *H01L 2225/107* (2013.01); *H01L 2225/1035* (2013.01); *H01L 2225/1041* (2013.01); *H01L 2225/1052* (2013.01); *H01L 2924/00013* (2013.01); *H01L 2924/01004* (2013.01); *H01L 2924/014* (2013.01); *H01L 2924/0105* (2013.01); *H01L 2924/01013* (2013.01); *H01L 2924/01029* (2013.01); *H01L 2924/01033* (2013.01); *H01L 2924/01047* (2013.01); *H01L 2924/01049* (2013.01); *H01L 2924/01073* (2013.01); *H01L 2924/01074* (2013.01); *H01L 2924/01078* (2013.01); *H01L 2924/01079* (2013.01); *H01L 2924/01082* (2013.01); *H01L 2924/01322* (2013.01); *H01L 2924/0665* (2013.01); *H01L 2924/078* (2013.01); *H01L 2924/12041* (2013.01); *H01L 2924/1306* (2013.01); *H01L 2924/13091* (2013.01); *H01L 2924/15153* (2013.01); *H01L 2924/15311* (2013.01); *H01L 2924/15331* (2013.01); *H05K 2201/10674* (2013.01)

(56) References Cited

U.S. PATENT DOCUMENTS

| | | |
|---|---|---|
| 5,543,657 A | 8/1996 | Diffenderfer et al. |
| 5,742,100 A | 4/1998 | Schroeder et al. |
| 5,770,888 A | 6/1998 | Song et al. |
| 5,841,193 A | 11/1998 | Eichelberger |
| 6,020,629 A | 2/2000 | Farnworth et al. |
| 6,291,892 B1 | 9/2001 | Yamaguchi |
| 6,297,547 B1 | 10/2001 | Akram |
| 6,380,624 B1 | 4/2002 | Hung |
| 6,417,462 B1 | 7/2002 | Dabral et al. |
| 6,590,281 B2 | 7/2003 | Wu et al. |
| 6,664,644 B2 | 12/2003 | Morozumi |
| 6,730,544 B1 | 5/2004 | Yang |
| 6,765,287 B1 | 7/2004 | Lin |
| 6,828,665 B2 | 12/2004 | Pu et al. |
| 6,881,607 B2 | 4/2005 | Farnworth |
| 7,023,085 B2 | 4/2006 | Pu |
| 7,071,568 B1 | 7/2006 | St. Amand et al. |
| 7,180,165 B2 | 2/2007 | Ellsberry et al. |
| 7,186,588 B1 | 3/2007 | Bayan et al. |
| 7,235,871 B2 | 6/2007 | Corisis |
| 7,261,596 B2 | 8/2007 | Akaike et al. |
| 7,361,531 B2 | 4/2008 | Sharma et al. |
| 7,368,811 B2 | 5/2008 | Kang et al. |
| 7,476,980 B2 | 1/2009 | Rebibis et al. |
| 7,550,832 B2 | 6/2009 | Weng et al. |
| 7,550,857 B1 | 6/2009 | Longo et al. |
| 7,579,691 B2 | 8/2009 | Sukegawa et al. |
| 7,608,921 B2 | 10/2009 | Pendse |
| 7,615,854 B2 | 11/2009 | Montgomery |
| 7,619,901 B2 | 11/2009 | Eichelberger et al. |
| 7,714,453 B2 | 5/2010 | Khan et al. |

(56) References Cited

U.S. PATENT DOCUMENTS

| | | |
|---|---|---|
| 7,728,420 B2 | 6/2010 | Cheah et al. |
| 7,745,918 B1 * | 6/2010 | Woodyard .................. 257/686 |
| 7,790,504 B2 | 9/2010 | Ramakrishna et al. |
| 7,834,464 B2 | 11/2010 | Meyer et al. |
| 7,838,337 B2 | 11/2010 | Marimuthu et al. |
| 7,843,052 B1 | 11/2010 | Yoo et al. |
| 7,880,280 B2 | 2/2011 | Otremba |
| 7,955,942 B2 | 6/2011 | Pagaila et al. |
| 7,964,450 B2 | 6/2011 | Camacho et al. |
| 8,039,384 B2 | 10/2011 | Pagaila et al. |
| 8,067,827 B2 | 11/2011 | Corisis |
| 8,184,453 B1 | 5/2012 | Kim et al. |
| 8,357,564 B2 | 1/2013 | Chi et al. |
| 2002/0028327 A1 | 3/2002 | Perry et al. |
| 2002/0098676 A1 | 7/2002 | Ning et al. |
| 2003/0020151 A1 | 1/2003 | Chen et al. |
| 2003/0032216 A1 | 2/2003 | Nakaoka et al. |
| 2003/0110788 A1 | 6/2003 | Koeneman et al. |
| 2003/0178719 A1 | 9/2003 | Combs et al. |
| 2003/0218250 A1 | 11/2003 | Kung et al. |
| 2004/0036164 A1 | 2/2004 | Koike et al. |
| 2004/0041243 A1 | 3/2004 | Ogawa |
| 2004/0067605 A1 | 4/2004 | Koizumi |
| 2004/0070064 A1 * | 4/2004 | Yamane et al. ............. 257/686 |
| 2004/0075164 A1 | 4/2004 | Pu et al. |
| 2004/0089943 A1 | 5/2004 | Kirigaya et al. |
| 2004/0155359 A1 | 8/2004 | Shen |
| 2004/0160752 A1 | 8/2004 | Yamashita et al. |
| 2004/0178499 A1 | 9/2004 | Mistry et al. |
| 2004/0219717 A1 | 11/2004 | Takahashi et al. |
| 2004/0238857 A1 | 12/2004 | Beroz et al. |
| 2004/0262774 A1 | 12/2004 | Kang et al. |
| 2004/0262811 A1 | 12/2004 | Lee et al. |
| 2005/0006730 A1 | 1/2005 | Owens et al. |
| 2005/0077626 A1 | 4/2005 | Seiller et al. |
| 2005/0133932 A1 | 6/2005 | Pohl et al. |
| 2005/0156296 A1 | 7/2005 | Wang et al. |
| 2005/0167812 A1 | 8/2005 | Yoshida et al. |
| 2006/0006517 A1 | 1/2006 | Lee et al. |
| 2006/0102994 A1 | 5/2006 | Pu |
| 2006/0125042 A1 | 6/2006 | Fuergut et al. |
| 2006/0128068 A1 | 6/2006 | Murray et al. |
| 2007/0122940 A1 | 5/2007 | Gautham |
| 2007/0158832 A1 | 7/2007 | Takaike |
| 2007/0181990 A1 | 8/2007 | Huang et al. |
| 2007/0254404 A1 | 11/2007 | Gerber et al. |
| 2007/0262346 A1 | 11/2007 | Otremba et al. |
| 2007/0290338 A1 | 12/2007 | Kuczynski |
| 2007/0290376 A1 | 12/2007 | Zhao et al. |
| 2008/0017968 A1 | 1/2008 | Choi et al. |
| 2008/0029869 A1 | 2/2008 | Kwon et al. |
| 2008/0054434 A1 | 3/2008 | Kim |
| 2008/0054437 A1 | 3/2008 | Hwang |
| 2008/0088019 A1 | 4/2008 | Lin et al. |
| 2008/0090405 A1 | 4/2008 | Fitzgerald et al. |
| 2008/0099925 A1 | 5/2008 | Irsigler et al. |
| 2008/0122059 A1 | 5/2008 | Chou et al. |
| 2008/0230879 A1 | 9/2008 | Sharma et al. |
| 2008/0230898 A1 | 9/2008 | Meguro et al. |
| 2008/0284001 A1 | 11/2008 | Mori et al. |
| 2008/0315372 A1 | 12/2008 | Kuan et al. |
| 2008/0315375 A1 | 12/2008 | Eichelberger et al. |
| 2008/0316714 A1 | 12/2008 | Eichelberger et al. |
| 2009/0072368 A1 | 3/2009 | Hu et al. |
| 2009/0079067 A1 | 3/2009 | Gerber |
| 2009/0091022 A1 * | 4/2009 | Meyer et al. .................. 257/723 |
| 2009/0108425 A1 | 4/2009 | Lee et al. |
| 2009/0115042 A1 | 5/2009 | Koyanagi |
| 2009/0127700 A1 | 5/2009 | Romig |
| 2009/0166886 A1 * | 7/2009 | Kim et al. ..................... 257/777 |
| 2009/0170241 A1 | 7/2009 | Shim et al. |
| 2009/0212401 A1 | 8/2009 | Do et al. |
| 2009/0224391 A1 | 9/2009 | Lin et al. |
| 2009/0236720 A1 * | 9/2009 | Yoon et al. .................... 257/686 |
| 2009/0278244 A1 | 11/2009 | Dunne et al. |
| 2009/0302227 A1 | 12/2009 | Keyser et al. |
| 2010/0019362 A1 | 1/2010 | Galera et al. |
| 2010/0025829 A1 | 2/2010 | Mengel et al. |
| 2010/0084749 A1 | 4/2010 | Hong et al. |
| 2010/0133655 A1 | 6/2010 | Nakanishi |
| 2010/0133665 A1 | 6/2010 | Ha et al. |
| 2010/0136749 A1 | 6/2010 | Bayan et al. |
| 2010/0164078 A1 | 7/2010 | Madrid et al. |
| 2010/0230792 A1 | 9/2010 | Irving et al. |
| 2010/0237495 A1 | 9/2010 | Pagaila et al. |
| 2010/0276792 A1 | 11/2010 | Chi et al. |
| 2010/0289126 A1 * | 11/2010 | Pagaila et al. ................. 257/659 |
| 2010/0289131 A1 | 11/2010 | Bathan et al. |
| 2011/0024888 A1 | 2/2011 | Pagaila et al. |
| 2011/0037155 A1 | 2/2011 | Pagaila |
| 2011/0037169 A1 | 2/2011 | Pagaila |
| 2011/0042798 A1 * | 2/2011 | Pagaila et al. ................. 257/692 |
| 2011/0068444 A1 * | 3/2011 | Chi et al. ....................... 257/669 |
| 2011/0186977 A1 * | 8/2011 | Chi et al. ....................... 257/686 |
| 2011/0204472 A1 | 8/2011 | Pagaila et al. |
| 2011/0254155 A1 | 10/2011 | Lin et al. |
| 2011/0278707 A1 | 11/2011 | Chi et al. |
| 2011/0278741 A1 | 11/2011 | Chua et al. |
| 2011/0291257 A1 | 12/2011 | Pagaila |
| 2012/0038064 A1 | 2/2012 | Camacho et al. |
| 2012/0193789 A1 | 8/2012 | Hu et al. |

FOREIGN PATENT DOCUMENTS

| | | |
|---|---|---|
| KR | 2003-0045950 | 12/2001 |
| TW | 200901411 A | 1/2009 |
| WO | 2005119776 A1 | 12/2005 |

* cited by examiner

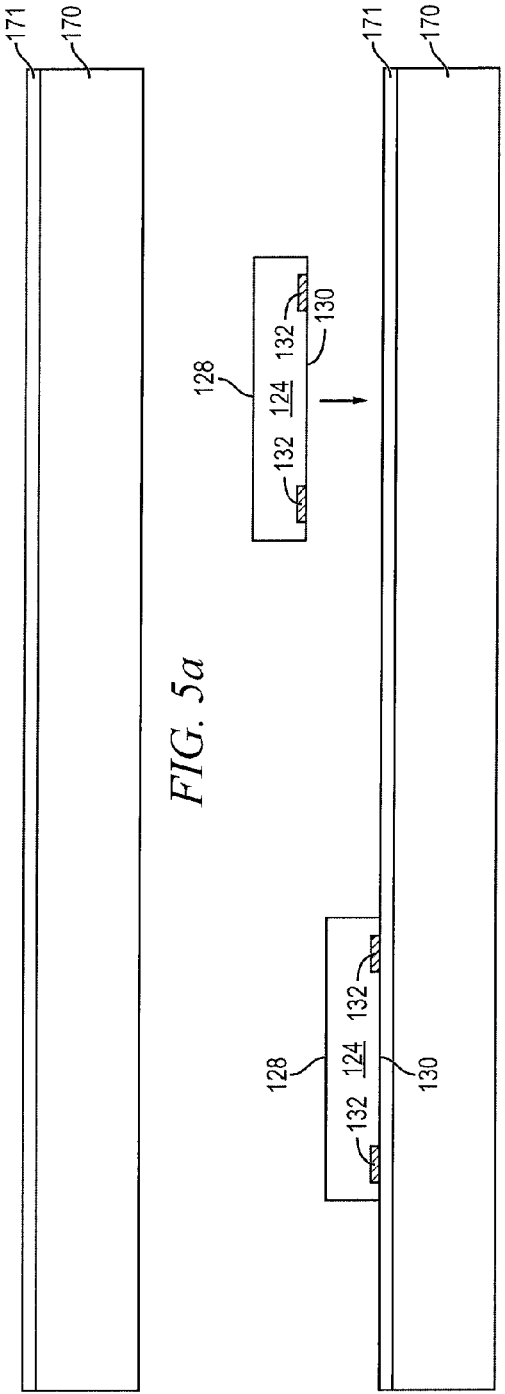
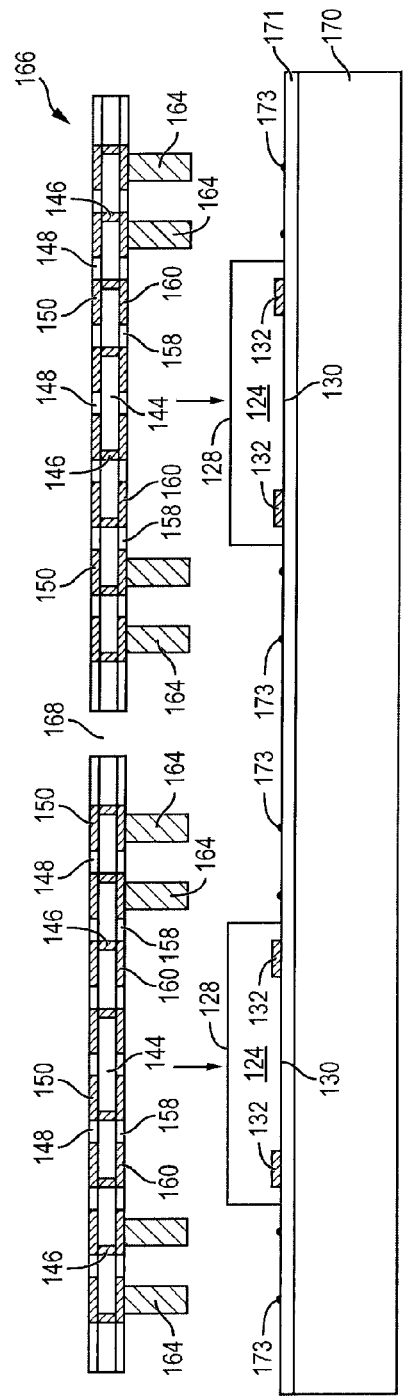
FIG. 5a
FIG. 5b
FIG. 5c

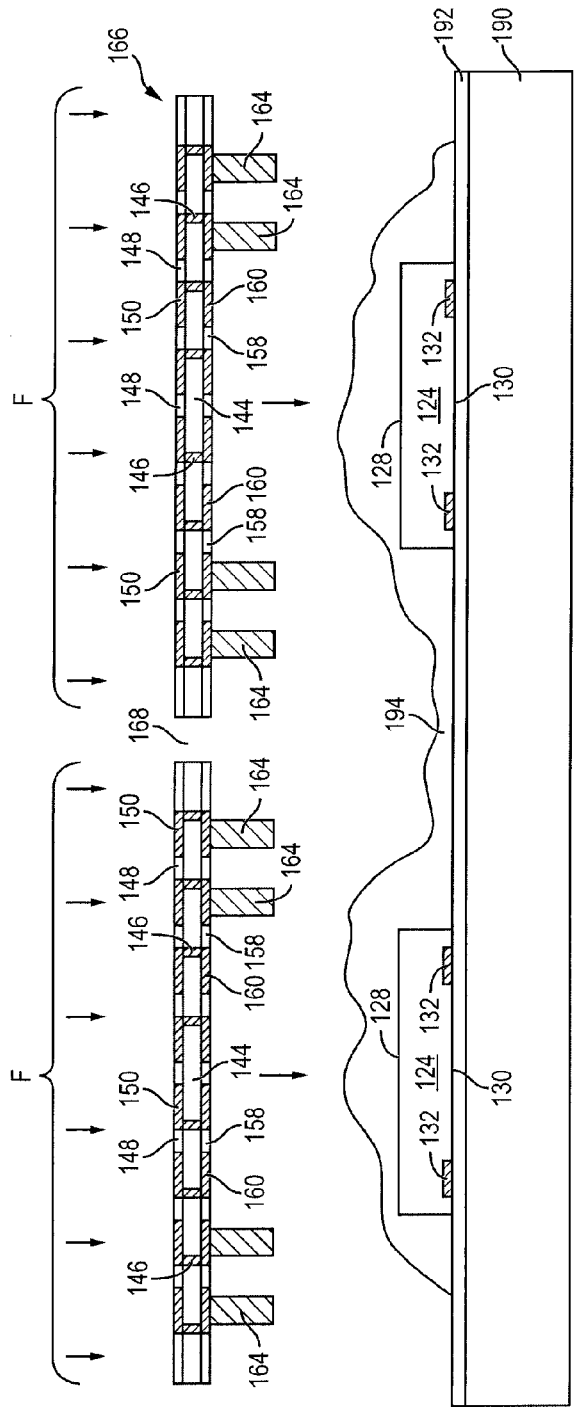
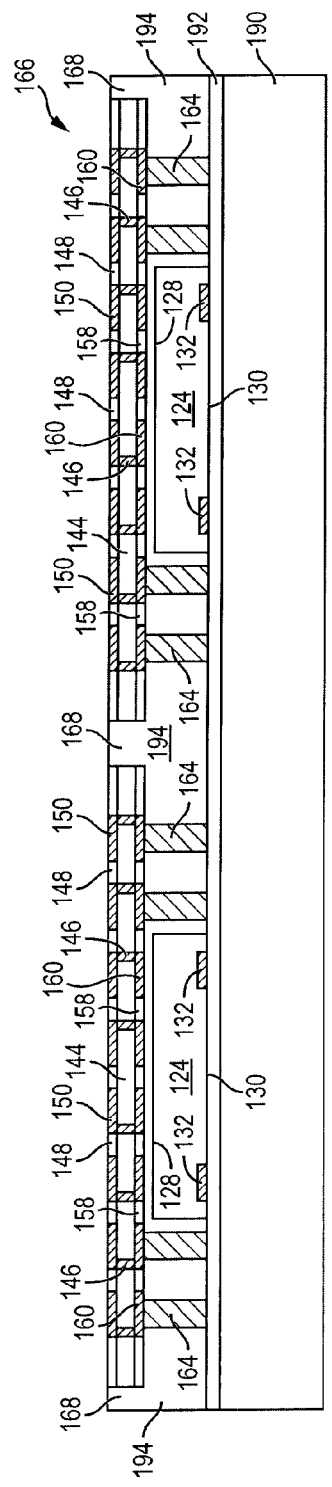
FIG. 8c
FIG. 8d

US 9,240,380 B2

SEMICONDUCTOR DEVICE AND METHOD OF FORMING INTERPOSER FRAME OVER SEMICONDUCTOR DIE TO PROVIDE VERTICAL INTERCONNECT

CLAIM TO DOMESTIC PRIORITY

The present application is a division of U.S. patent application Ser. No. 12/875,981, now U.S. Pat. No. 8,383,457, filed Sep. 3, 2010, which application is incorporated herein by reference and which is a continuation-in-part of U.S. Pat. application Ser. No. 12/545,357, now U.S. Pat. No. 8,169,058, filed Aug. 21, 2009.

FIELD OF THE INVENTION

The present invention relates in general to semiconductor devices and, more particularly, to a semiconductor device and method of forming an interposer frame over a semiconductor die to provide vertical electrical interconnect.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

In a conventional fan-out wafer level chip scale package (Fo-WLCSP), a semiconductor die is typically enclosed by an encapsulant. A top and bottom build-up interconnect structure are formed over opposite surfaces of the encapsulant. A redistribution layer (RDL) and insulating layer are commonly formed within the top and bottom build-up interconnect structures. In addition, a conductive pillar is typically formed through the encapsulant for z-direction vertical electrical interconnect between the top and bottom interconnect structures. The conductive pillar and RDL formation are known to use complicated, expensive, and time-consuming processes involving lithography, etching, and metal deposition.

SUMMARY OF THE INVENTION

A need exists to provide z-direction vertical electrical interconnect for a Fo-WLCSP while reducing conductive pillar and RDL formation for lower manufacturing costs. Accordingly, in one embodiment, the present invention is a semiconductor device comprising a first semiconductor die and interposer substrate including a plurality of conductive pillars disposed over the first semiconductor die. An encapsulant is deposited through an opening in the interposer substrate over the first semiconductor die. An interconnect structure is formed over the encapsulant and first semiconductor die and electrically connected to the conductive pillars.

In another embodiment, the present invention is a semiconductor device comprising a first semiconductor die and substrate including an opening formed through the substrate and a plurality of conductive pillars formed over the substrate. The first semiconductor die is disposed over the substrate between the conductive pillars. An encapsulant is deposited over the first semiconductor die. An interconnect structure is formed over the encapsulant and first semiconductor die and electrically connected to the conductive pillars.

In another embodiment, the present invention is a semiconductor device comprising a first semiconductor die and first encapsulant deposited over the first semiconductor die. A substrate includes an opening formed through the substrate and a plurality of conductive pillars formed over the substrate. The substrate is disposed over the first semiconductor die and first encapsulant.

In another embodiment, the present invention is a semiconductor device comprising a first semiconductor die and substrate including an opening formed through the substrate and a plurality of conductive pillars formed over the substrate. The first semiconductor die is disposed over the substrate between the conductive pillars. An encapsulant is deposited over the first semiconductor die and substrate.

BRIEF DESCRIPTION OF THE DRAWINGS

FIGS. 5a-5h illustrate a process of forming a Fo-WLCSP with an interposer frame and conductive pillars providing vertical interconnect for a semiconductor die;

FIGS. 8a-8g illustrate mounting the interposer frame over an encapsulant slurry;

DETAILED DESCRIPTION OF THE DRAWINGS

Figure 1:
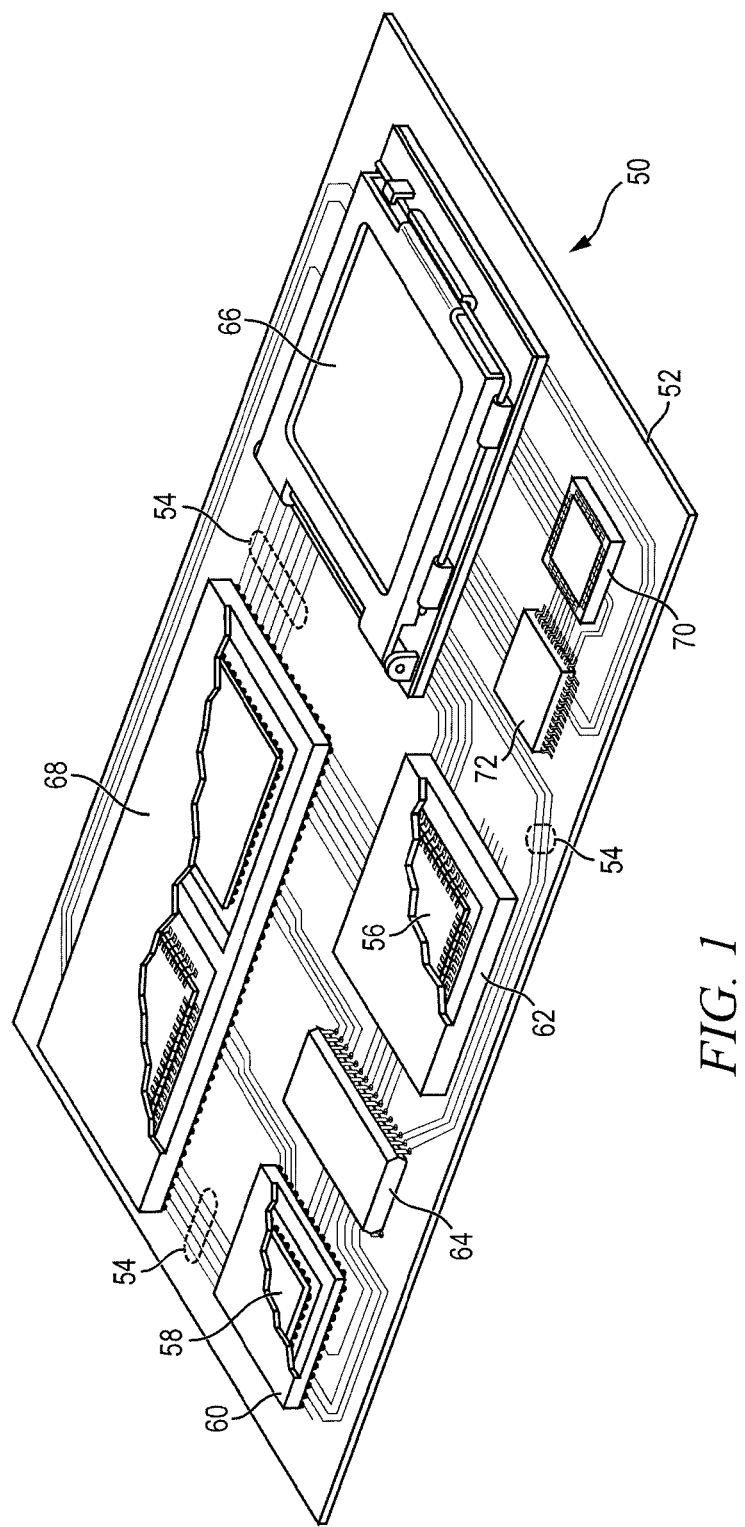
FIG. 1 illustrates a PCB with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 1 for purposes of illustration.

Electronic device 50 may be a stand-alone system that uses the semiconductor packages to perform one or more electrical functions. Alternatively, electronic device 50 may be a subcomponent of a larger system. For example, electronic device 50 may be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. The miniaturization and the weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
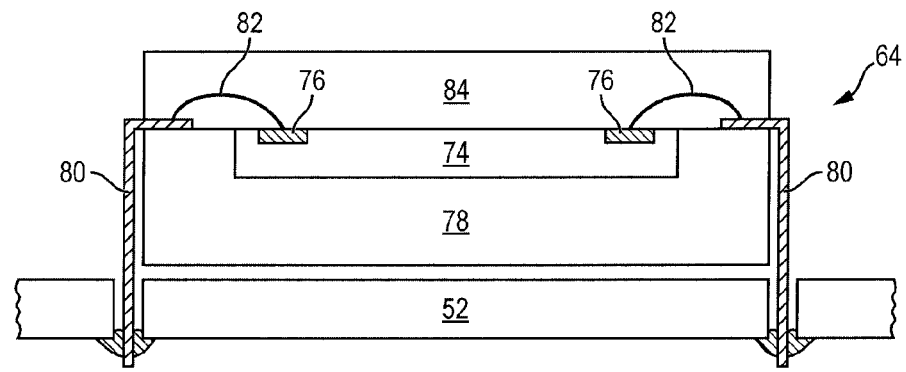
FIGS. 2a-2c illustrate further detail of the representative semiconductor packages mounted to the PCB.
Figure 2B:
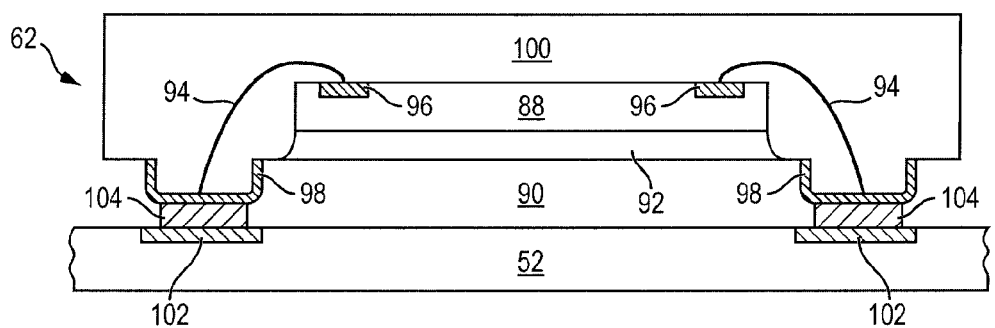
Figure 2C:
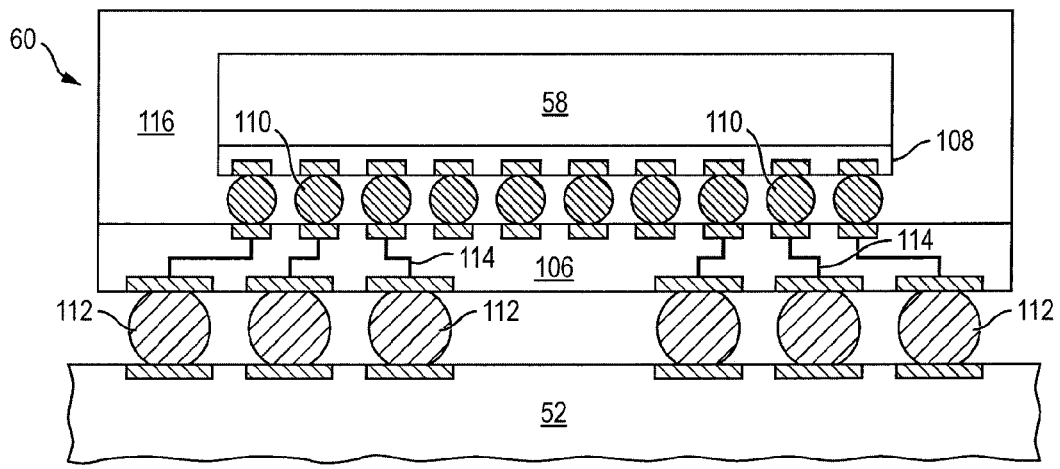

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 2b illustrates further detail of BCC 62 mounted on PCB 52. Semiconductor die 88 is mounted over carrier 90 using an underfill or epoxy-resin adhesive material 92. Wire bonds 94 provide first level packaging interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 3A:
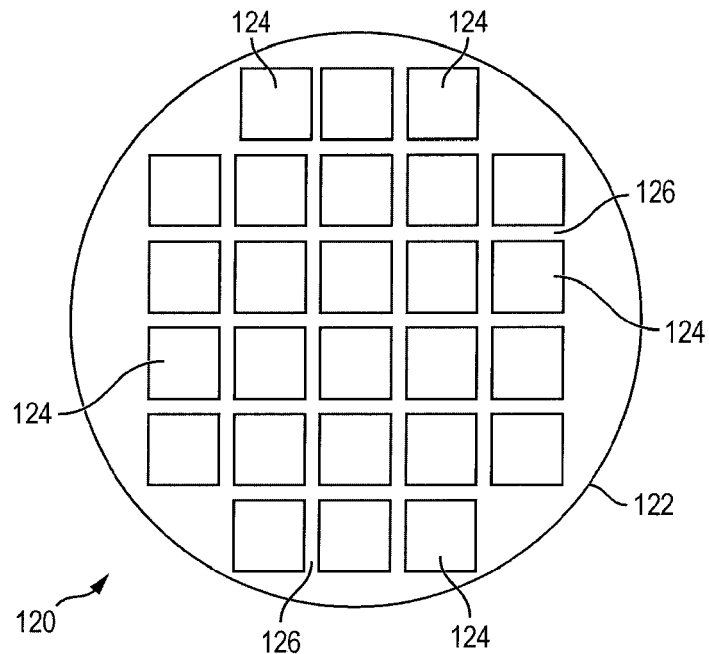
FIGS. 3a-3c illustrate a semiconductor wafer with a plurality of semiconductor die separated by saw streets.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by saw streets 126 as described above.

Figure 3B:
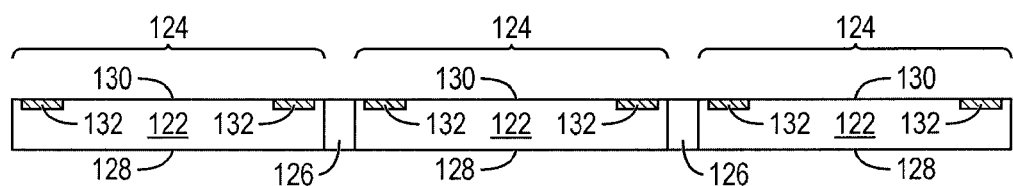

FIG. 3b shows a cross-sectional view of a portion of semiconductor wafer 120. Each semiconductor die 124 has a back surface 128 and an active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPD), such as inductors, capacitors, and resistors, for RF signal processing. In one embodiment, semiconductor die 124 is a flipchip type semiconductor die.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130.

Figure 3C:
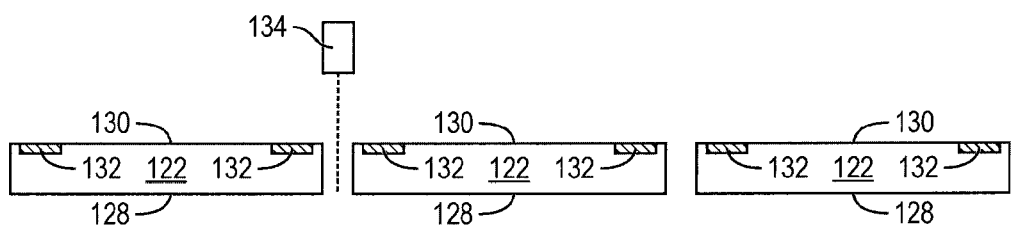

In FIG. 3c, semiconductor wafer 120 is singulated through saw street 126 using a saw blade or laser cutting tool 134 into individual semiconductor die 124.

Figure 4A:
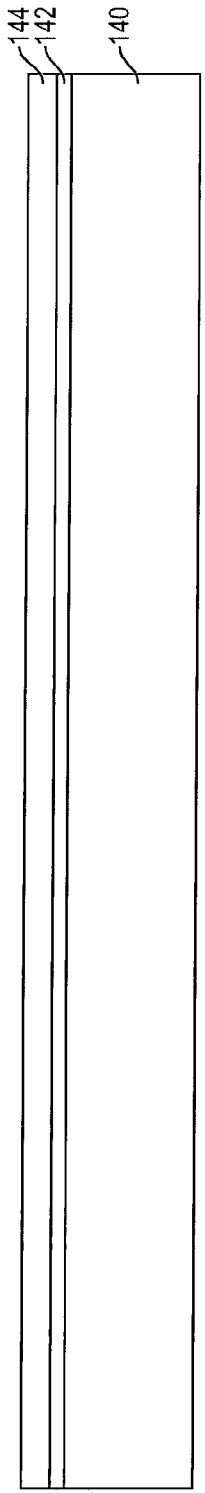
FIGS. 4a-4f illustrate a pre-formed interposer frame with conductive pillars formed over the interposer frame.

FIG. 4a-4f shows formation of a wafer-form, strip interposer with conductive pillars. In FIG. 4a, a substrate or carrier 140 contains temporary or sacrificial base material such as silicon, polymer, beryllium oxide, or other suitable low-cost, rigid material for structural support. An interface layer or double-sided tape 142 is formed over carrier 140 as a temporary adhesive bonding film or etch-stop layer. A semiconductor wafer or substrate 144 contains a base material, such as silicon, germanium, gallium arsenide, indium phosphide, or silicon carbide, for structural support. As a semiconductor wafer, substrate 144 can contain embedded semiconductor die or passive devices. Substrate 144 can also be a multi-layer laminate, ceramic, or leadframe. Substrate 144 is mounted to interface layer 142 over carrier 140.

Figure 4B:
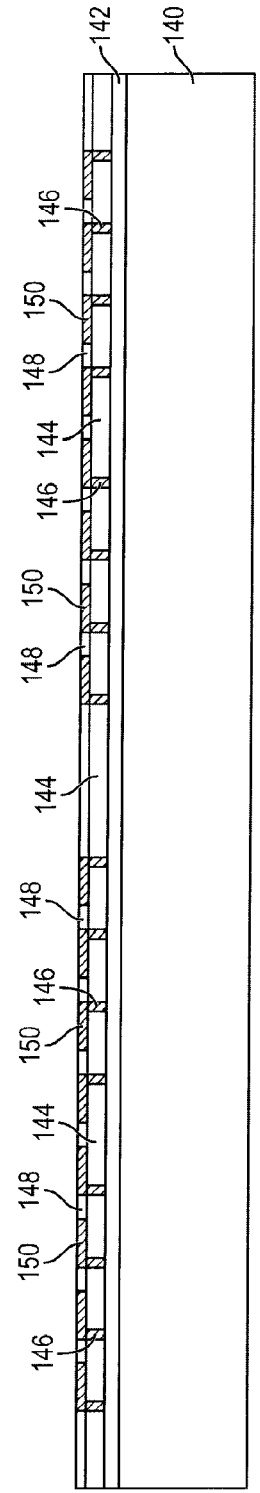

In FIG. 4b, a plurality of vias is formed through substrate 144 using laser drilling, mechanical drilling, or deep reactive ion etching (DRIE). The vias are filled with Al, Cu, Sn, Ni, Au, Ag, titanium (Ti), tungsten (W), poly-silicon, or other suitable electrically conductive material using electrolytic plating, electroless plating process, or other suitable metal deposition process to form z-direction vertical interconnect conductive vias 146.

An insulating or passivation layer 148 is formed over a surface of substrate 144 and conductive vias 146 using PVD, CVD, printing, spin coating, spray coating, sintering or thermal oxidation. The insulating layer 148 contains one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. A portion of insulating layer 148 is removed by an etching process to expose substrate 144 and conductive vias 146.

An electrically conductive layer or RDL 150 is formed over the exposed substrate 144 and conductive vias 146 using a patterning and metal deposition process such as printing, PVD, CVD, sputtering, electrolytic plating, and electroless plating. Conductive layer 150 can be one or more layers of Al, Cu, Sn, Ni, Au, Ag, or other suitable electrically conductive material. Conductive layer 150 is electrically connected to conductive vias 146.

Figure 4C:
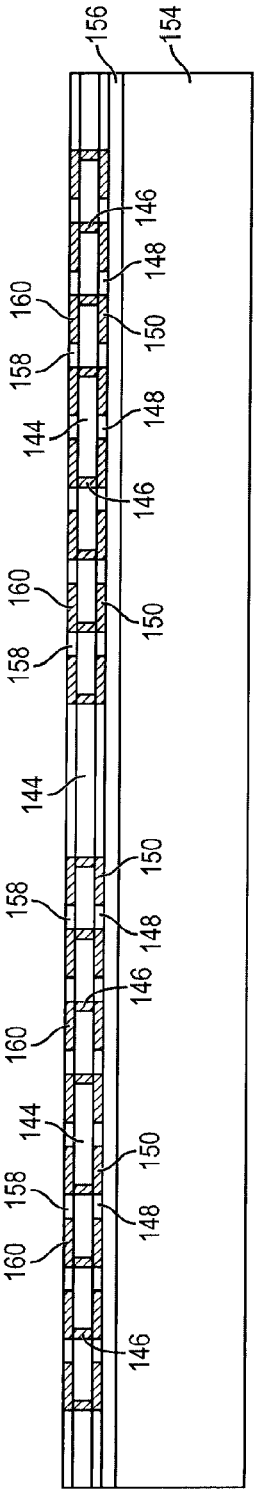

In FIG. 4c, a substrate or carrier 154 contains temporary or sacrificial base material such as silicon, polymer, beryllium oxide, or other suitable low-cost, rigid material for structural support. An interface layer or double-sided tape 156 is formed over carrier 154 as a temporary adhesive bonding film or etch-stop layer. Leading with insulating layer 148 and conductive layer 150, substrate 144 is mounted to interface layer 156 over carrier 154. Carrier 140 and interface layer 142 are removed by chemical etching, mechanical peeling, CMP, mechanical grinding, thermal bake, UV light, laser scanning, or wet stripping to expose a surface of substrate 144 and conductive vias 146 opposite conductive layer 150.

An insulating or passivation layer 158 is formed over substrate 144 and conductive vias 146 using PVD, CVD, printing, spin coating, spray coating, sintering or thermal oxidation. The insulating layer 158 contains one or more layers of SiO2, Si3N4, SiON, Ta2O5, Al2O3, or other material having similar insulating and structural properties. A portion of insulating layer 158 is removed by an etching process to expose substrate 144 and conductive vias 146.

An electrically conductive layer or RDL 160 is formed over the exposed substrate 144 and conductive vias 146 using a patterning and metal deposition process such as printing, PVD, CVD, sputtering, electrolytic plating, and electroless plating. Conductive layer 160 can be one or more layers of Al, Cu, Sn, Ni, Au, Ag, or other suitable electrically conductive material. Conductive layer 160 is electrically connected to conductive vias 146.

In another embodiment, conductive vias 146 are formed through substrate 144 after forming conductive layers 150 and/or 160.

Figure 4D:
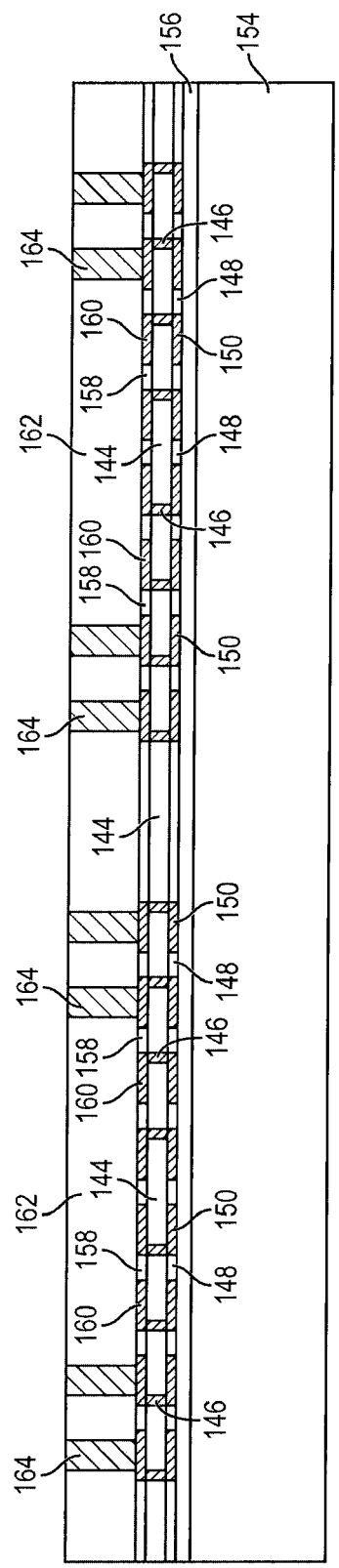

In FIG. 4d, a photoresist layer 162 is formed over insulating layer 158 and conductive layer 160. A plurality of vias is formed through photoresist layer 162 over conductive layer 160 using a patterning and etching process. The vias are filled with Al, Cu, Sn, Ni, Au, Ag, Ti, W, poly-silicon, or other suitable electrically conductive material using electrolytic plating, electroless plating process, or other suitable metal deposition process. Stacked bumps and stud bumps can also be formed in the vias.

Figure 4E:
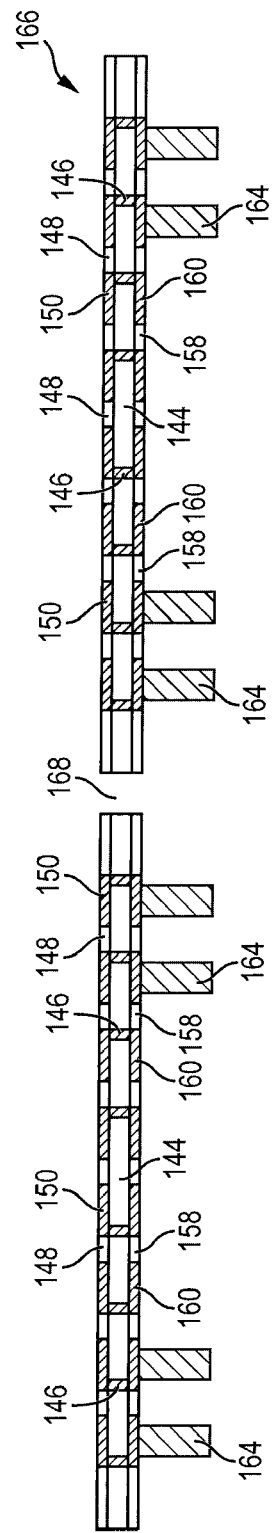
Figure 4F:
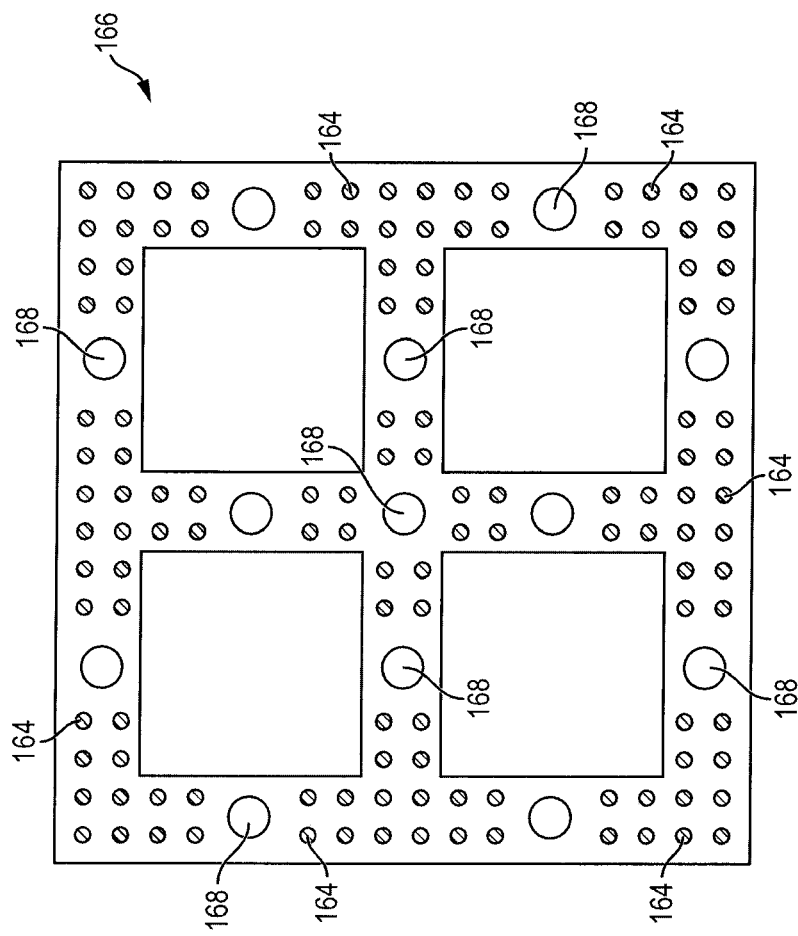

In FIG. 4e, photoresist layer 162 is removed leaving z-direction vertical interconnect conductive pillars 164 over conductive layer 160. Carrier 154 and interface layer 156 are removed by chemical etching, mechanical peeling, CMP, mechanical grinding, thermal bake, UV light, laser scanning, or wet stripping leaving the pre-formed interposer frame 166 with conductive pillars 164. Conductive layers 150 and 160 and conductive vias 146 constitute a vertical interconnect formed through interposer frame 166. One or more openings 168 are formed through interposer frame 166. FIG. 4f shows a top view of interposer frame 166 with conductive pillars 164 and openings 168.

Figure 5D:
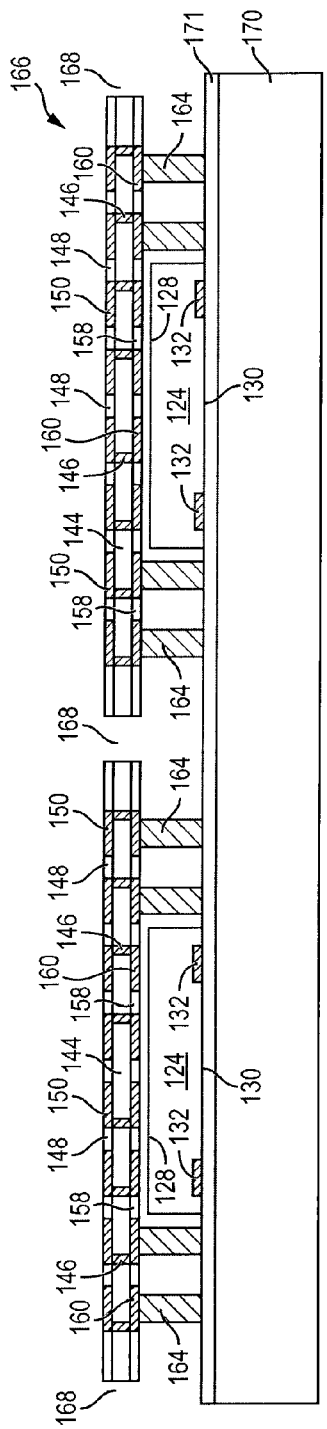

FIGS. 5a-5h illustrate, in relation to FIGS. 1 and 2a-2c, a process of forming a Fo-WLCSP with an interposer frame and conductive pillars providing vertical interconnect for a semiconductor die. In FIG. 5a, a substrate or carrier 170 contains temporary or sacrificial base material such as silicon, polymer, beryllium oxide, or other suitable low-cost, rigid material for structural support. An interface layer or double-sided tape 171 is formed over carrier 170 as a temporary adhesive bonding film or etch-stop layer.

In FIG. 5b, semiconductor die 124 from FIGS. 3a-3c are mounted over interface layer 171. In particular, semiconductor die 124 are mounted to interface layer 171 with active surface 130 oriented toward carrier 170.

In FIG. 5c, the pre-formed interposer frame 166 is positioned over carrier 170. The interposer frame 166 is mounted to interface layer 171 with conductive pillars 164 disposed around semiconductor die 124, as shown in FIG. 5d. Alignment marks 173 can be made on interface layer 171 to assist with mounting interposer frame 166. Solder paste can also be deposited on carrier 170 to assist with alignment and bonding of interposer frame 166 to the carrier. The height of conductive pillars 164 is greater than a thickness of semiconductor die 124. Accordingly, a gap remains between back surface 128 of semiconductor die 124 and interposer frame 166.

Figure 5E:
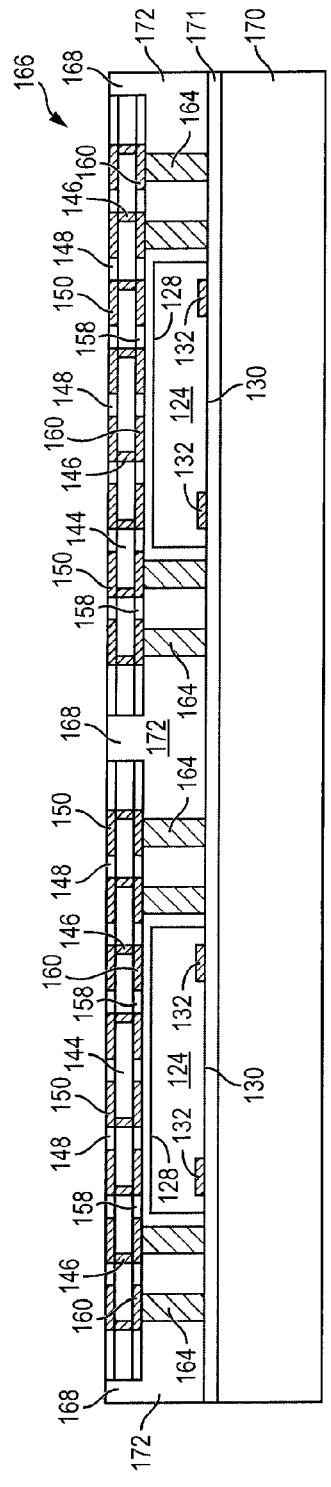

In FIG. 5e, an encapsulant or molding compound 172 is injected or deposited through openings 168 around semiconductor die 124 and in the gap between interposer frame 166 and the die using a paste printing, compressive molding, transfer molding, liquid encapsulant molding, vacuum lamination, spin coating, or other suitable applicator. Encapsulant 172 can be polymer composite material, such as epoxy resin with filler, epoxy acrylate with filler, or polymer with proper filler. Encapsulant 172 is non-conductive and environmentally protects the semiconductor device from external elements and contaminants. Semiconductor die 124 can be mounted to wettable contact pads formed over carrier 170 to reduce die shifting during encapsulation.

Figure 5F:
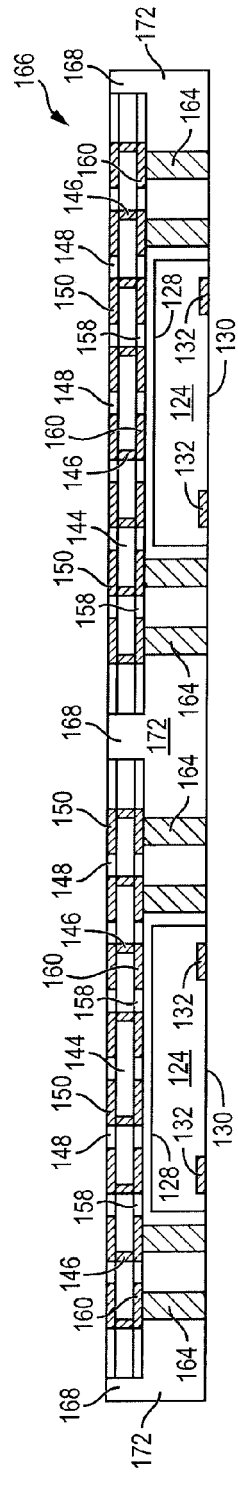

In FIG. 5f, carrier 170 and interface layer 171 are removed by chemical etching, mechanical peeling, CMP, mechanical grinding, thermal bake, UV light, laser scanning, or wet stripping to expose encapsulant 172, semiconductor die 124, and conductive pillars 164.

Figure 5G:
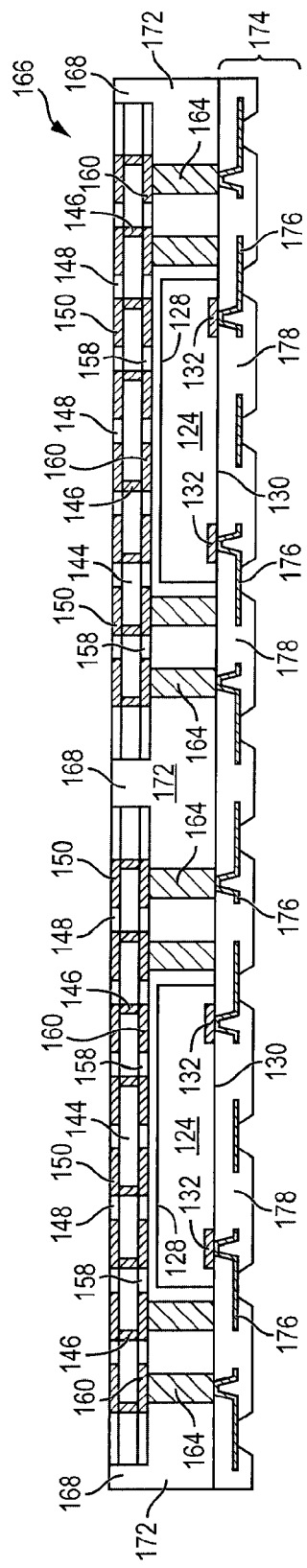

In FIG. 5g, a build-up interconnect structure 174 is formed over semiconductor die 124, conductive pillars 164, and encapsulant 172. The build-up interconnect structure 174 includes an electrically conductive layer or RDL 176 formed using a patterning and metal deposition process such as sputtering, electrolytic plating, and electroless plating. Conductive layer 176 can be one or more layers of Al, Cu, Sn, Ni, Au, Ag, or other suitable electrically conductive material. One portion of conductive layer 176 is electrically connected to contact pads 132 of semiconductor die 124. Another portion of conductive layer 176 is electrically connected to conductive pillars 164. Other portions of conductive layer 176 can be electrically common or electrically isolated depending on the design and function of semiconductor die 124.

An insulating or passivation layer 178 is formed around conductive layer 176 for electrical isolation using PVD, CVD, printing, spin coating, spray coating, sintering or thermal oxidation. The insulating layer 178 contains one or more layers of SiO2, Si3N4, SiON, Ta2O5, Al2O3, or other material having similar insulating and structural properties. A portion of insulating layer 178 can be removed by an etching process to expose conductive layer 176 for additional electrical interconnect.

Figure 5H:
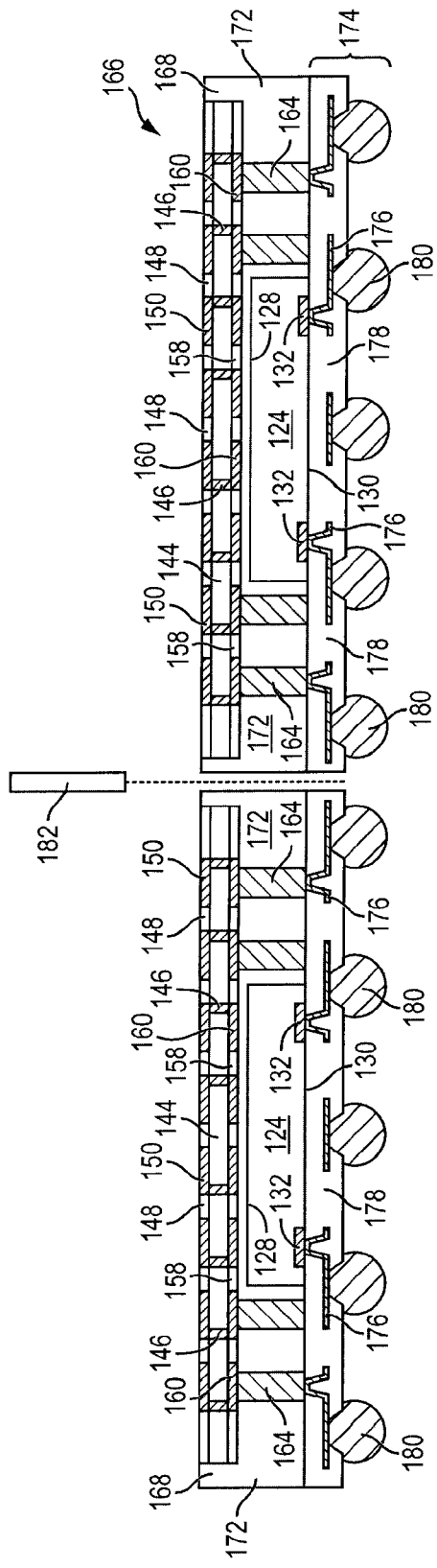

In FIG. 5h, an electrically conductive bump material is deposited over build-up interconnect structure 174 and electrically connected to the exposed portion of conductive layer 176 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 176 using a suitable attachment or bonding process. In one embodiment, the bump material is reflowed by heating the material above its melting point to form spherical balls or bumps 180. In some applications, bumps 180 are reflowed a second time to improve electrical contact to conductive layer 176. An under bump metallization (UBM) can be formed under bumps 180. The bumps can also be compression bonded to conductive layer 176. Bumps 180 represent one type of interconnect structure that can be formed over conductive layer 176. The interconnect structure can also use stud bump, micro bump, or other electrical interconnect.

Figure 6:
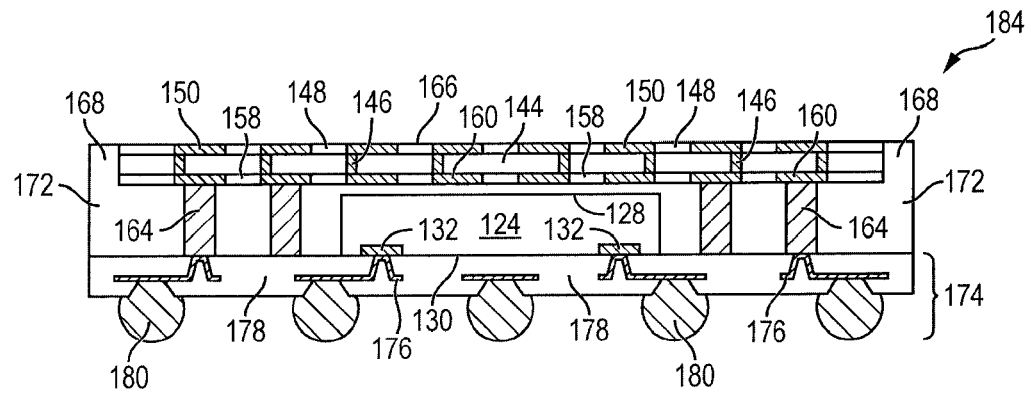
FIG. 6 illustrates the Fo-WLCSP with the interposer frame and conductive pillars providing vertical interconnect for the semiconductor die.

Semiconductor die 124 are singulated through interposer frame 166, encapsulant 172, and build-up interconnect structure 174 with saw blade or laser cutting tool 182 into individual Fo-WLCSP 184. FIG. 6 shows Fo-WLCSP 184 after singulation. Semiconductor die 124 is electrically connected through contact pads 132 and build-up interconnect structure 174 to conductive pillars 164 and interposer frame 166. The pre-formed interposer frame 166 simplifies the assembly process by negating the need for RDL patterning over at least one surface of encapsulant 172, or forming conductive pillars through the encapsulant.

Figure 7:
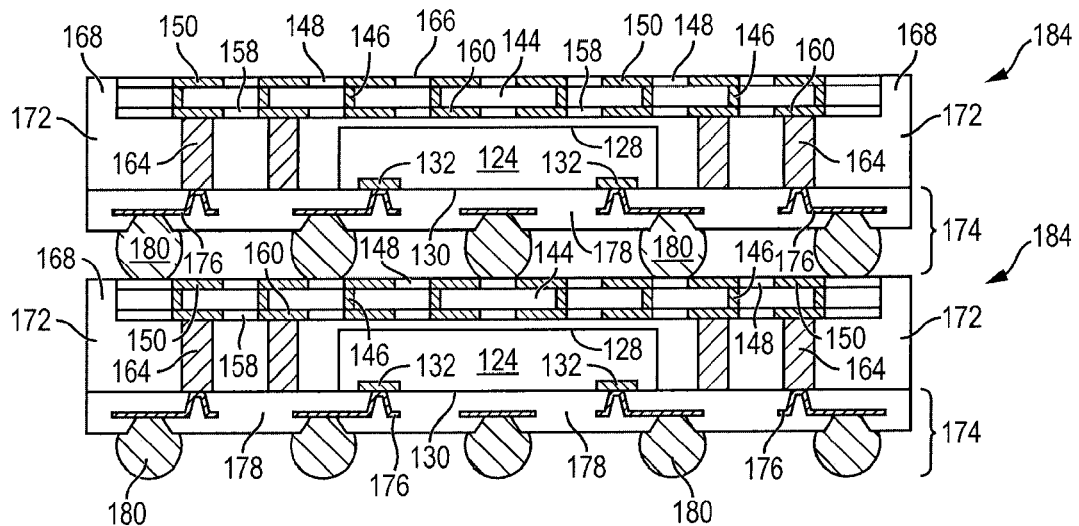
FIG. 7 illustrates a plurality of stack Fo-WLCSP each with an interposer frame and conductive pillars providing vertical interconnect for the semiconductor die.

FIG. 7 shows a plurality of stacked Fo-WLCSP 184 electrically connected through interposer frame 166, build-up interconnect structure 174, bumps 180, and conductive vias 164.

Figure 8A:
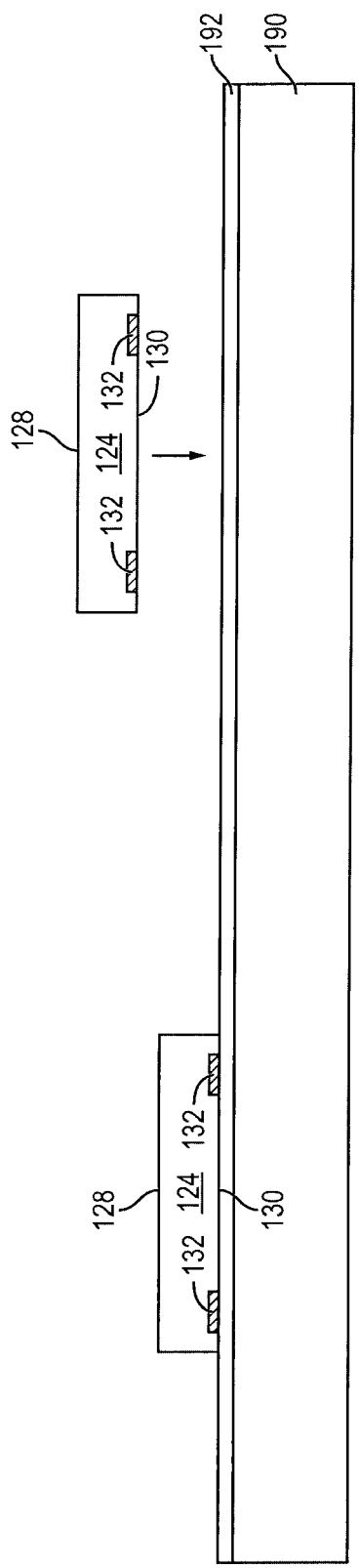

FIGS. 8a-8g illustrate, in relation to FIGS. 1 and 2a-2c, another process of forming a Fo-WLCSP with an interposer frame and conductive pillars providing vertical interconnect for a semiconductor die. In FIG. 8a, a substrate or carrier 190 contains temporary or sacrificial base material such as silicon, polymer, beryllium oxide, or other suitable low-cost, rigid material for structural support. An interface layer or double-sided tape 192 is formed over carrier 190 as a temporary adhesive bonding film or etch-stop layer.

Semiconductor die 124 from FIG. 3a-3c are mounted over interface layer 192. In particular, semiconductor die 124 are mounted to interface layer 192 with active surface 130 oriented toward carrier 190.

Figure 8B:
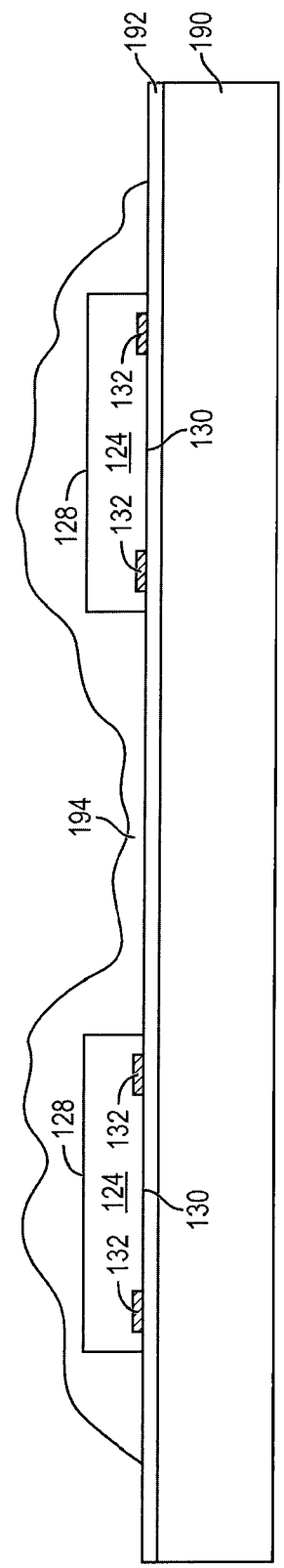

In FIG. 8b, an encapsulant or molding compound 194 is deposited over carrier 190 and semiconductor die 124 as a slurry. Encapsulant slurry 194 can be polymer composite material, such as epoxy resin with filler, epoxy acrylate with filler, or polymer with proper filler.

In FIG. 8c, the pre-formed interposer frame 166 from FIGS. 4a-4f is positioned over carrier 190. The interposer frame 166 is mounted to interface layer 192 by pressing the interposer frame onto encapsulant slurry 194 with force F. The pressure from force F causes encapsulant slurry 194 to flatten and completely fill the area under interposer frame 166 around semiconductor die 124 and conductive pillars 164. Excess encapsulant slurry 194 exits through openings 168.

When properly seated, conductive pillars 164 are disposed around semiconductor die 124 and contacting interface layer 192, as shown in FIG. 8d. Encapsulant 194 surrounds semiconductor die 124 and conductive pillars 164. The height of conductive pillars 164 is greater than a thickness of semiconductor die 124. Accordingly, back surface 128 of semiconductor die 124 is covered by encapsulant 194. Semiconductor die 124 can be mounted to wettable contact pads formed over carrier 190 to reduce die shifting during encapsulation.

Figure 8E:
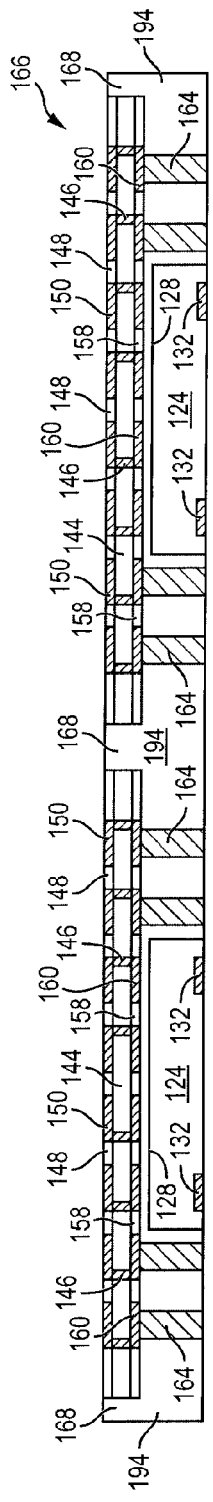

In FIG. 8e, carrier 190 and interface layer 192 are removed by chemical etching, mechanical peeling, CMP, mechanical grinding, thermal bake, UV light, laser scanning, or wet stripping to expose encapsulant 194, semiconductor die 124, and conductive pillars 164.

Figure 8F:
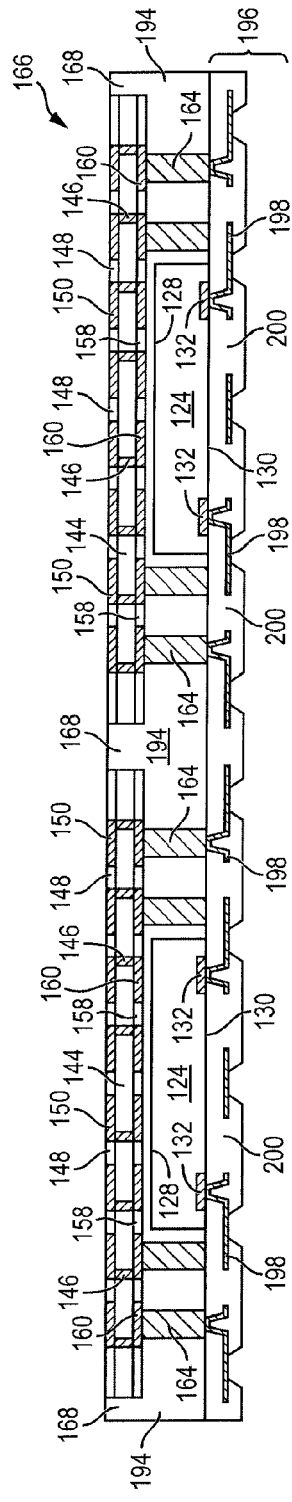

In FIG. 8f, a build-up interconnect structure 196 is formed over semiconductor die 124, conductive pillars 164, and encapsulant 194. The build-up interconnect structure 196 includes an electrically conductive layer or RDL 198 formed using a patterning and metal deposition process such as sputtering, electrolytic plating, and electroless plating. Conductive layer 198 can be one or more layers of Al, Cu, Sn, Ni, Au, Ag, or other suitable electrically conductive material. One portion of conductive layer 198 is electrically connected to contact pads 132 of semiconductor die 124. Another portion of conductive layer 198 is electrically connected to conductive pillars 164. Other portions of conductive layer 198 can be electrically common or electrically isolated depending on the design and function of semiconductor die 124.

An insulating or passivation layer 200 is formed around conductive layer 198 for electrical isolation using PVD, CVD, printing, spin coating, spray coating, sintering or thermal oxidation. The insulating layer 200 contains one or more layers of SiO2, Si3N4, SiON, Ta2O5, Al2O3, or other material having similar insulating and structural properties. A portion of insulating layer 200 can be removed by an etching process to expose conductive layer 198 for additional electrical interconnect.

Figure 8G:
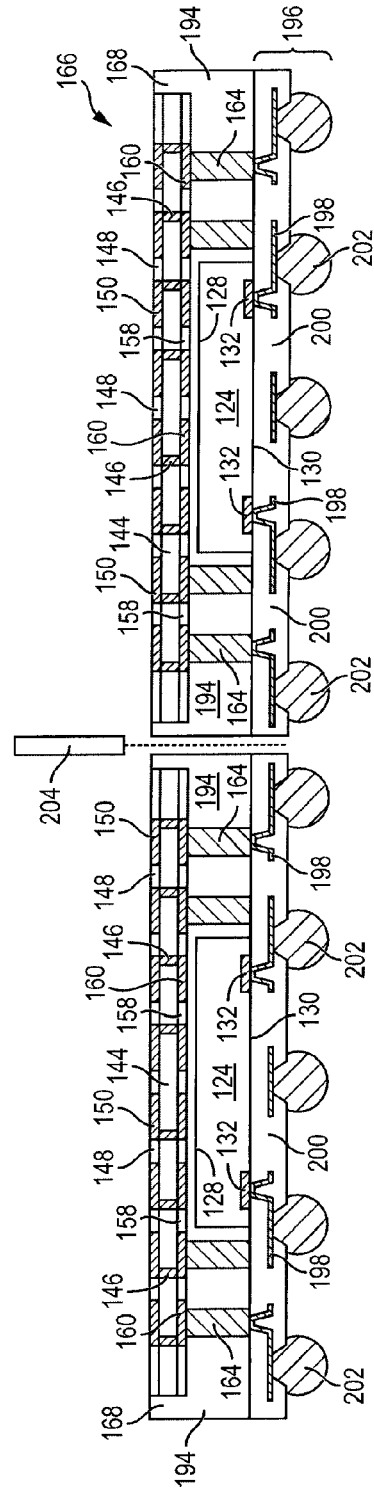

In FIG. 8g, an electrically conductive bump material is deposited over build-up interconnect structure 196 and electrically connected to the exposed portion of conductive layer 198 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 198 using a suitable attachment or bonding process. In one embodiment, the bump material is reflowed by heating the material above its melting point to form spherical balls or bumps 202. In some applications, bumps 202 are reflowed a second time to improve electrical contact to conductive layer 198. A UBM can be formed under bumps 202. The bumps can also be compression bonded to conductive layer 198. Bumps 202 represent one type of interconnect structure that can be formed over conductive layer 198. The interconnect structure can also use stud bump, micro bump, or other electrical interconnect.

Figure 9:
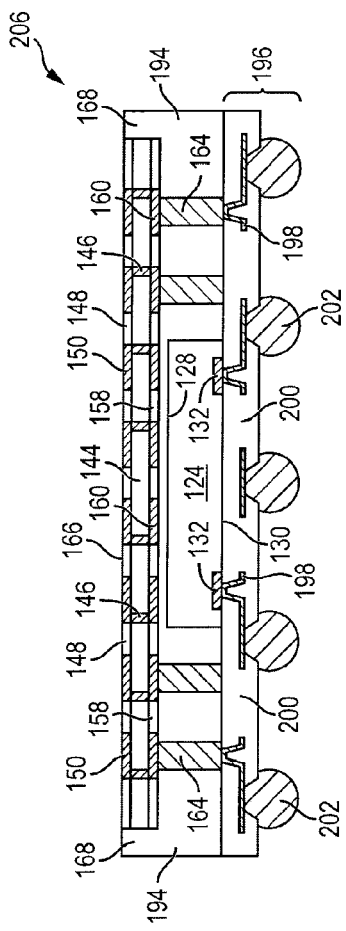
FIG. 9 illustrates the Fo-WLCSP with the interposer frame mounted over the encapsulant slurry.

Semiconductor die 124 are singulated through interposer frame 166, encapsulant 194, and build-up interconnect structure 196 with saw blade or laser cutting tool 204 into individual Fo-WLCSP 206. FIG. 9 shows Fo-WLCSP 206 after singulation. Semiconductor die 124 is electrically connected through contact pads 132 and build-up interconnect structure 196 to conductive pillars 164 and interposer frame 166. The pre-formed interposer frame 166 simplifies the assembly process by negating the need for RDL patterning over at least one surface of encapsulant 194, or forming conductive pillars through the encapsulant. Depositing encapsulant slurry 194 prior to mounting interposer frame 166 and then pressing the interposer frame over the encapsulant slurry provides uniform coverage of the encapsulant around semiconductor die 124 and conductive pillars 164.

Figure 10A:
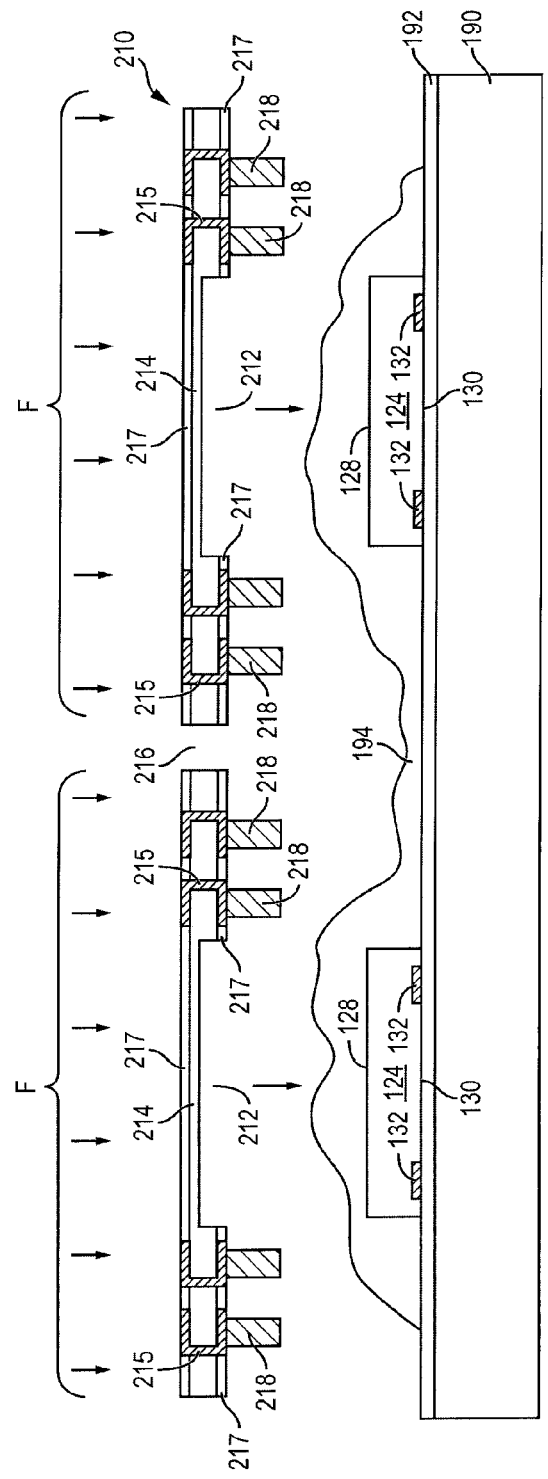
FIGS. 10a-10e illustrate forming the interposer frame with cavities to partially contain the semiconductor die.

FIGS. 10a-10e illustrate, in relation to FIGS. 1 and 2a-2c, another process of forming a Fo-WLCSP with an interposer frame and conductive pillars providing vertical interconnect for a semiconductor die. Continuing from FIG. 8b, a pre-formed interposer frame 210 is positioned over carrier 190, as shown in FIG. 10a. In this case, interposer frame 210 has cavities or recesses 212 formed in substrate 214 in areas designated for alignment with semiconductor die 124. Conductive vias and layers 215 are formed through substrate 214 and insulating layer 217 similar to FIGS. 4a-4f. One or more openings 216 are formed through interposer frame 210. The interposer frame 210 is mounted to interface layer 192 by pressing the interposer frame onto encapsulant slurry 194 with force F. The pressure from force F causes encapsulant slurry 194 to flatten and completely fill the area under interposer frame 210 and around semiconductor die 124 and conductive pillars 218. Excess encapsulant slurry 194 exits through openings 216.

Figure 10B:
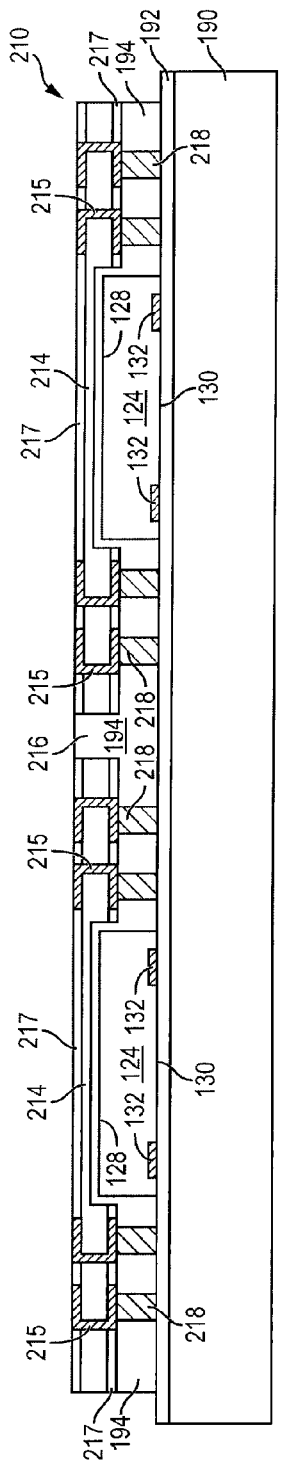

When properly seated, semiconductor die 124 are partially disposed within cavities 212. Conductive pillars 218 are disposed around semiconductor die 124 and contacting interface layer 192, as shown in FIG. 10b. Encapsulant 194 surrounds semiconductor die 124 and conductive pillars 164. Semiconductor die 124 can be mounted to wettable contact pads formed over carrier 190 to reduce die shifting during encapsulation.

Figure 10C:
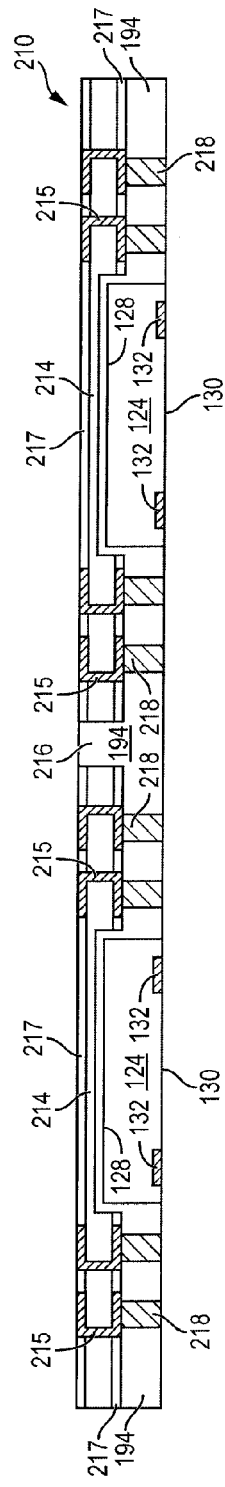

In FIG. 10c, carrier 190 and interface layer 192 are removed by chemical etching, mechanical peeling, CMP, mechanical grinding, thermal bake, UV light, laser scanning, or wet stripping to expose encapsulant 194, semiconductor die 124, and conductive pillars 218.

Figure 10D:
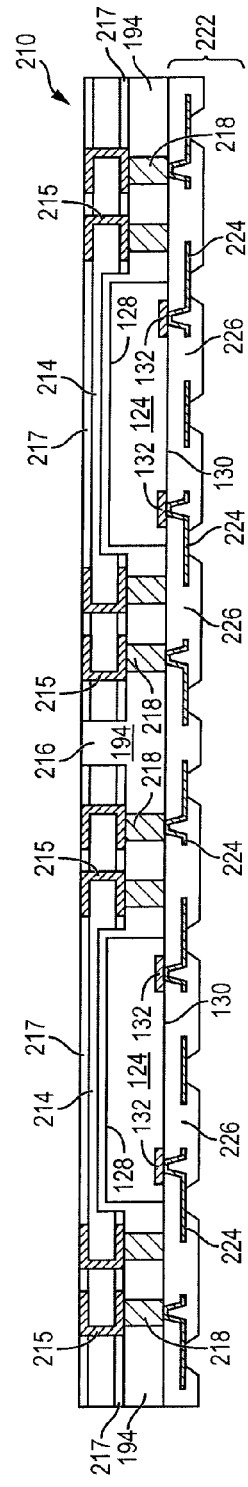

In FIG. 10d, a build-up interconnect structure 222 is formed over semiconductor die 124, conductive pillars 218, and encapsulant 194. The build-up interconnect structure 222 includes an electrically conductive layer or RDL 224 formed using a patterning and metal deposition process such as sputtering, electrolytic plating, and electroless plating. Conductive layer 224 can be one or more layers of Al, Cu, Sn, Ni, Au, Ag, or other suitable electrically conductive material. One portion of conductive layer 224 is electrically connected to contact pads 132 of semiconductor die 124. Another portion of conductive layer 224 is electrically connected to conductive pillars 218. Other portions of conductive layer 224 can be electrically common or electrically isolated depending on the design and function of semiconductor die 124.

An insulating or passivation layer 226 is formed around conductive layer 226 for electrical isolation using PVD, CVD, printing, spin coating, spray coating, sintering or thermal oxidation. The insulating layer 226 contains one or more layers of SiO2, Si3N4, SiON, Ta2O5, Al2O3, or other material having similar insulating and structural properties. A portion of insulating layer 226 can be removed by an etching process to expose conductive layer 224 for additional electrical interconnect.

Figure 10E:
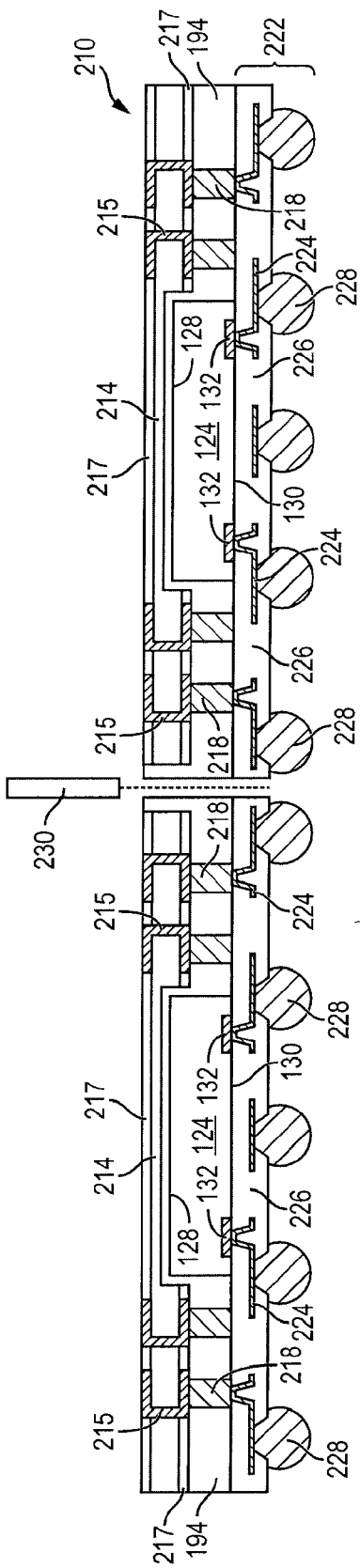

In FIG. 10e, an electrically conductive bump material is deposited over build-up interconnect structure 222 and electrically connected to the exposed portion of conductive layer 224 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 224 using a suitable attachment or bonding process. In one embodiment, the bump material is reflowed by heating the material above its melting point to form spherical balls or bumps 228. In some applications, bumps 228 are reflowed a second time to improve electrical contact to conductive layer 224. A UBM can be formed under bumps 228. The bumps can also be compression bonded to conductive layer 224. Bumps 228 represent one type of interconnect structure that can be formed over conductive layer 224. The interconnect structure can also use stud bump, micro bump, or other electrical interconnect.

Figure 11:
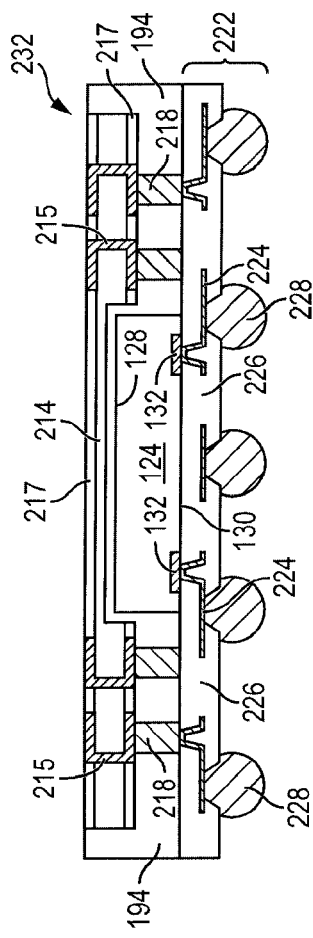
FIG. 11 illustrates the Fo-WLCSP with the semiconductor die partially contained within the cavities of the interposer frame.

Semiconductor die 124 are singulated through interposer frame 210, encapsulant 194, and build-up interconnect structure 196 with saw blade or laser cutting tool 230 into individual Fo-WLCSP 232. FIG. 11 shows Fo-WLCSP 232 after singulation. Semiconductor die 124 is electrically connected through contact pads 132 and build-up interconnect structure 222 to conductive pillars 218 and interposer frame 210. The pre-formed interposer frame 210 simplifies the assembly process by negating the need for RDL patterning over at least one surface of encapsulant 194, or forming conductive pillars through the encapsulant. Depositing encapsulant slurry 194 prior to mounting interposer frame 210 and then pressing the interposer frame over the encapsulant slurry provides uniform coverage of the encapsulant around semiconductor die 124. Cavities 212 reduce the height of Fo-WLCSP 232.

Figure 12:
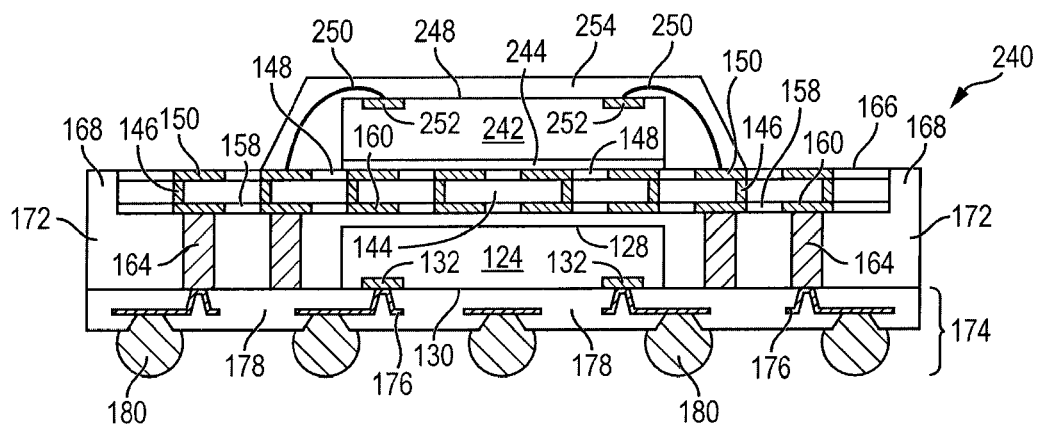
FIG. 12 illustrates the Fo-WLCSP with a bond wire type semiconductor die mounted over the interposer frame.

FIG. 12 shows an embodiment of Fo-WLCSP 240, similar to FIG. 6, with semiconductor die 242 mounted to interposer frame 166 with die attach adhesive 244. Semiconductor die 242 has an active surface 248 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 248 to implement analog circuits or digital circuits, such as DSP, ASIC, memory, or other signal processing circuit. Semiconductor die 242 may also contain IPDs, such as inductors, capacitors, and resistors, for RF signal processing. In one embodiment, semiconductor die 242 is a wire-bond die. Bond wires 250 are electrically connected between contact pads 252 on active surface 248 and conductive layer 150 of interposer frame 166.

An encapsulant or molding compound 254 is deposited over semiconductor die 242 and interposer frame 166 using a paste printing, compressive molding, transfer molding, liquid encapsulant molding, vacuum lamination, spin coating, or other suitable applicator. Encapsulant 254 can be polymer composite material, such as epoxy resin with filler, epoxy acrylate with filler, or polymer with proper filler. Encapsulant 254 is non-conductive and environmentally protects the semiconductor device from external elements and contaminants.

Figure 13:
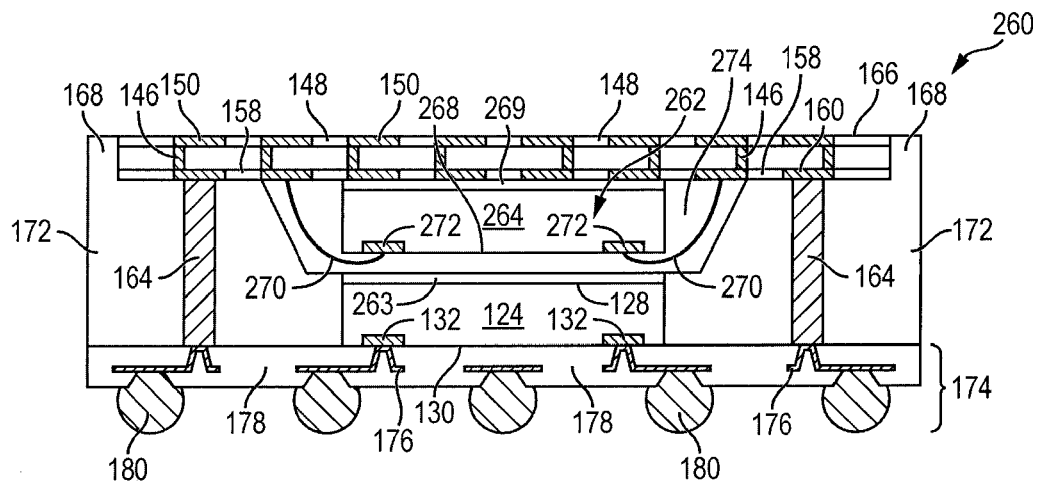
FIG. 13 illustrates the Fo-WLCSP with an ISM mounted over the semiconductor die.

FIG. 13 shows an embodiment of Fo-WLCSP 260, similar to FIG. 6, with internal stacking module (ISM) 262 mounted to semiconductor die 124 with die attach adhesive 263 prior to mounting interposer frame 166 in FIG. 5c. The internal stacking module 262 includes semiconductor die 264 with an active surface 268 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 268 to implement analog circuits or digital circuits, such as DSP, ASIC, memory, or other signal processing circuit. Semiconductor die 264 may also contain IPDs, such as inductors, capacitors, and resistors, for RF signal processing. Semiconductor die 264 is mounted to interposer frame 166 with die attach adhesive 269. Bond wires 270 are electrically connected between contact pads 272 on active surface 268 and conductive layer 160 of interposer frame 166.

An encapsulant or molding compound 274 is deposited over semiconductor die 264 and interposer frame 166 using a paste printing, compressive molding, transfer molding, liquid encapsulant molding, vacuum lamination, spin coating, or other suitable applicator. Encapsulant 274 can be polymer composite material, such as epoxy resin with filler, epoxy acrylate with filler, or polymer with proper filler. Encapsulant 274 is non-conductive and environmentally protects the semiconductor device from external elements and contaminants.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
   a first semiconductor die;
   a pre-formed interposer substrate including a plurality of conductive pillars extending from a surface of the pre-formed interposer substrate with the conductive pillars disposed around the first semiconductor die and a gap between the semiconductor die and pre-formed interposer substrate;
   an encapsulant deposited through an opening in the pre-formed interposer substrate over the first semiconductor die, the opening disposed outside a footprint of the first semiconductor die; and
   an interconnect structure formed over the encapsulant and first semiconductor die and electrically connected to the pre-formed interposer substrate through the conductive pillars.

2. The semiconductor device of claim 1, further including a cavity formed in the pre-formed interposer substrate to contain a portion of the first semiconductor die.

3. The semiconductor device of claim 1, further including a second semiconductor die disposed over the first semiconductor die.

4. The semiconductor device of claim 1, further including a second semiconductor die disposed over the pre-formed interposer substrate.

5. The semiconductor device of claim 4, further including a bond wire formed between the second semiconductor die and the pre-formed interposer substrate.

6. The semiconductor device of claim 1, further including a plurality of stacked semiconductor devices electrically connected through the pre-formed interposer substrate and interconnect structure.

7. The semiconductor device of claim 1, wherein the encapsulant covers a side surface of the pre-formed interposer substrate.

8. A semiconductor device, comprising:
   a first semiconductor die;
   a substrate including an opening formed through the substrate and a plurality of conductive pillars extending from a surface of the substrate, the substrate being disposed over a first surface of the first semiconductor die and the conductive pillars disposed around a second surface of the first semiconductor die adjacent to the first surface;
   an encapsulant deposited over the first semiconductor die; and
   an interconnect structure formed over the encapsulant and substrate and electrically connected to the conductive pillars.

9. The semiconductor device of claim 8, wherein the opening in the substrate is adapted for injecting encapsulant or exhausting excess encapsulant.

10. The semiconductor device of claim 8, further including a cavity formed in the substrate to contain a portion of the first semiconductor die.

11. The semiconductor device of claim 8, further including a second semiconductor die disposed over the first semiconductor die.

12. The semiconductor device of claim 8, further including a plurality of stacked semiconductor devices electrically connected through the substrate and interconnect structure.

13. The semiconductor device of claim 8, further including a second semiconductor die disposed over the substrate.

14. The semiconductor device of claim 13, further including a bond wire formed between the second semiconductor die and substrate.

15. The semiconductor device of claim 8, wherein the encapsulant covers a side surface of the pre-formed substrate.

16. A semiconductor device, comprising:
   a plurality of first semiconductor dies;
   a pre-formed substrate disposed over the first semiconductor dies;
   a plurality of conductive pillars extending from a surface of the pre-formed substrate and disposed around the first semiconductor dies to provide standoff leaving a gap between the first semiconductor dies and the surface of the pre-formed substrate;

a first encapsulant deposited around the first semiconductor dies and conductive pillars with an opening in the pre-formed substrate located between the first semiconductor dies; and an interconnect structure formed over the first encapsulant and first semiconductor dies opposite the pre-formed substrate and electrically connected to the pre-formed substrate through the conductive pillars.

17. The semiconductor device of claim 16, wherein the opening in the pre-formed substrate is adapted for injecting encapsulant or exhausting excess encapsulant.

18. The semiconductor device of claim 16, further including a cavity formed in the pre-formed substrate to contain a portion of one of the first semiconductor dies.

19. The semiconductor device of claim 16, further including a second semiconductor die disposed over one of the first semiconductor dies.

20. The semiconductor device of claim 14, further including a second semiconductor die disposed over the pre-formed substrate.

21. The semiconductor device of claim 20, further including a second encapsulant deposited over the second semiconductor die.

22. The semiconductor device of claim 16, wherein the first encapsulant covers a side surface of the pre-formed substrate.

23. A semiconductor device, comprising:
a first semiconductor die;
a pre-formed substrate including a plurality of conductive pillars extending from a surface of the pre-formed substrate, the pre-formed substrate being disposed over the first semiconductor die with the conductive pillars disposed around the first semiconductor die;
an encapsulant deposited around the first semiconductor die and conductive pillars with an opening in the pre-formed substrate; and
an interconnect structure formed over the first semiconductor die and encapsulant opposite the pre-formed substrate and coupled to the conductive pillars.

24. The semiconductor device of claim 23, further including a cavity formed in the pre-formed substrate to contain a portion of the first semiconductor die.

25. The semiconductor device of claim 23, further including a second semiconductor die disposed over the pre-formed substrate.

26. The semiconductor device of claim 23, wherein the encapsulant covers a side surface of the pre-formed substrate.

27. The semiconductor device of claim 23, further including a gap between the first semiconductor die and pre-formed substrate.

* * * * *